(12) United States Patent
Matsushita et al.

(10) Patent No.: US 7,072,369 B2
(45) Date of Patent: Jul. 4, 2006

(54) DEPOLARIZED LASER DIODE MODULE AND DEPOLARIZED LASER DIODE LIGHT SOURCE

(75) Inventors: Shunichi Matsushita, Chiyoda-ku (JP); Shu Namiki, Chiyoda-ku (JP); Yoshihiro Emori, Chiyoda-ku (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 252 days.

(21) Appl. No.: 10/820,771

(22) Filed: Apr. 9, 2004

(65) Prior Publication Data

US 2006/0109875 A1   May 25, 2006

Related U.S. Application Data

(63) Continuation of application No. PCT/JP02/10526, filed on Oct. 10, 2002.

(30) Foreign Application Priority Data

Oct. 10, 2001  (JP)  ............................. 2001-313334
Apr. 12, 2002  (JP)  ............................. 2002-110573

(51) Int. Cl.
*H01S 3/13*  (2006.01)
*H01S 3/30*  (2006.01)

(52) U.S. Cl. .................... 372/29.02; 372/6; 359/341.1; 359/333

(58) Field of Classification Search ............. 372/29.02, 372/32, 6; 359/341.1, 333
See application file for complete search history.

(56) References Cited

U.S. PATENT DOCUMENTS 6,775,057 B1 *  8/2004  Akasaka et al. ......... 359/337.5

2004/0109230 A1 *  6/2004  Matsushita et al. ...... 359/341.3

FOREIGN PATENT DOCUMENTS

| JP | 08-254668 | 10/1996 |
|----|-----------|---------|
| JP | 09-179152 | 7/1997 |
| JP | 2001-147454 | 5/2001 |
| JP | 2002-31735 | 1/2002 |
| JP | 2002-122896 | 4/2002 |

* cited by examiner

OTHER PUBLICATIONS

Yoshihiro Emori et al, "Cost-effective depolarized diode pump unit designed for C-band flat-gain Raman amplifiers to control EDFA fain profile", Optical Fiber Communication Conference.(OFC). Technical Digest Postconference Eddition. vol. 4 of 4, Mar. 7, 2000, pp. 106-108.

*Primary Examiner*—Minsun Harvey
*Assistant Examiner*—Ernest Unelus
(74) *Attorney, Agent, or Firm*—Oblon, Spivak, McClelland, Maier & Neustadt, P.C.

(57) ABSTRACT

The present invention provides the following designing method: in a laser diode module or a depolarized laser diode module which has one laser diode and one polarization maintaining fiber connected to the output side thereof, the length of the polarization maintaining fiber is a value obtained by calculation of equation 37 with use of a longitudinal mode spacing $\Delta\lambda$ output light from the Fabry Perot (FP) laser diode, an oscillating center wavelength $\lambda_0$ of the laser light, a beat length $L_{Beat\ 1}$ of the polarization maintaining fiber and an optical wavelength $\lambda_{Beat}$ used in the measurement of the $L_{Beat\ 1}$. (Equation 37)

$$L_{Pig} < \frac{\lambda_0^2}{\Delta\lambda} \times \frac{L_{Beat\ 1}}{\lambda_{Beat\ 1}}$$

86 Claims, 16 Drawing Sheets

LD spectrum of cavity length 1mm

LD spectrum of cavity length 1.3mm

LD spectrum of cavity length 1.5mm

Temperature variation of DOP and Extinction ratio

LD:FWHM=0.75nm, Q-Series, $\theta$ =5° PMF=1m, Beat length=5.2mm@1550nm
Depolarizer:15m, Beat length=5.2mm@1550nm Temperature variation of DOP
–Series, Depolarizer: PMF=12m, Beat Length=5.2mm@1550nm Ldepo=17m, Lpig=1m, Extinction ratio=15.7dB, $\Delta \lambda$ =0.20nm Ldepo=17m, Lpig=1m, Extinction ratio=15.7dB, $\Delta \lambda$ =0.20nm Ldepo=17m, Lpig=1m, Extinction ratio=27dB, $\Delta \lambda$ =0.20nm Ldepo=17m, Lpig=1m, Extinction ratio=27dB, $\Delta \lambda$ =0.20nm Depolarizer

DEPOLARIZED LASER DIODE MODULE AND DEPOLARIZED LASER DIODE LIGHT SOURCE

BACKGROUND OF THE INVENTION

1. Field of the Invention

The present invention relates to a method for designing the length of a polarization maintaining fiber provided at the output side of a laser diode module for outputting laser light to be depolarized, a method for designing the length of a depolarizer, a laser diode module and a depolarized laser diode module manufactured based on the design method, and an optical amplifier which utilizes such a laser diode module as a pump light source.

2. Related Art

An optical amplifier for amplifying signal light in an optical fiber by utilizing as pumping means laser light from a semiconductor laser device (laser diode: LD) plays an important role in a optical communication system. Among such optical amplifiers, an optical fiber Raman amplifier, which utilizes a Stimulated Raman Scattering in an optical fiber, has outstanding noise performance. Therefore, an optical fiber Raman amplifier has become indispensable for optical amplifying means in a long-distance transmission system, and for speed enhancement of a transmission signal.

Since optical Raman amplification uses the Stimulated Raman Scattering process occurring in an optical fiber, the size of a Raman gain for signal light largely depends on cross relationship between the state of polarization of the signal light and that of pump light. For example, where the state of polarization of pump light is linear polarization (usually, the polarization of laser light output from an LD is approximately linear polarization), when the state of polarization of the signal light is linear in the same direction as that of the pump light, the Raman gain becomes high, and when the direction of polarization of the signal light is orthogonal to that of the pump light, the Raman gain becomes reduced. In other words, there is Polarization Dependence of Gain (Polarization Dependent Gain: PDG) such that the amount of a gain depends on mutual relationship between the state of polarization of signal light and that of pump light.

In order to diminish the polarization dependent gain of Raman amplification, pump laser light is preferably laser light of which the state of polarization is changed at an extremely short time interval. As such laser light, one is such as obtained by polarization beam combining of two LDs of the same wavelength and the other is such as depolarized by a depolarizer arranged at an output side of an LD. Both of them present small DOP values (Degree Of Polarization) indicative of the percentage of a polarized component and their states of polarization are both change at extremely short time intervals.

Used as a depolarizer for depolarizing laser light output from an LD are birefringent crystals and birefringent optical fibers. A DOP value depends on the length of these depolarizers (distance in the direction of light travel), and it is known that basically, the longer a depolarizer is, the smaller the DOP value becomes and that the DOP value also depends on an FWHM (full width half maximum) of laser light spectrum output from an LD. For this reason, conventionally, the following method was applied to reduce a DOP value. First, the length of a depolarizer was roughly determined on the basis of conventional design information in the light of qualitative relationship between an FWHM of an LD and the DOP, then the depolarizer of determined length was coupled to a polarization maintaining fiber provided at the output side of a laser diode module, and the fiber length was adjusted while actually measuring DOP values.

However, with the above-mentioned method, it was required to fine-adjust the length of a depolarizer while measuring the DOP values of output laser light, which produced a problem that fine adjustment took a lot of time and troubles and increased manufacturing cost. In addition, the DOP was actually decreased not uniformly over the length of the depolarizer and took a maximum value periodically, and therefore, in order to evade the maximum value, it was required to fine-adjust the length of the depolarizer while measuring the DOP values.

Further, even if the length of a depolarizer was optimized with use of the above-described method, since a DOP value varied corresponding to fluctuation of the ambient temperature of a depolarized laser diode module, fine adjustment was hard to realize, and so was a small value of DOP (e.g., 10% or less). Furthermore, the fluctuation of DOP caused fluctuation in Raman gain, which necessitates controlling of the ambient temperature of the depolarized laser diode module.

SUMMARY OF THE INVENTION

According to the present invention, the length of a polarization maintaining fiber provided at the output side of a laser diode is optimized by the use of a cavity length of the laser diode and the oscillating center wavelength, an oscillating spectrum FWHM (full width half maximum), extinction ratio, the beat length of the polarization maintaining fiber so as to eliminate the temperature dependence of a DOP value and stabilize the DOP value. In addition, the present invention makes it possible to determine the cavity length of a laser diode and the oscillating center wavelength, an oscillating spectrum FWHM and the length of a birefringent material used for depolarization, uniquely.

A first embodiment of a depolarized laser diode module according to the present invention is a depolarized laser diode module comprising:

a laser diode module having one laser diode and one polarization maintaining fiber which is connected to an output side of the laser diode and;

a depolarizer connected to said laser diode module, in which a length $L_{Pig}$ of the polarization maintaining fiber is a value obtained by calculation of equation 1 with use of a longitudinal mode spacing $\Delta\lambda$ of output light from the laser diode, an oscillating center wavelength $\lambda_0$ of the laser light, a beat length $L_{Beat\ 1}$ of the polarization maintaining fiber and an optical wavelength $\lambda_{Beat}$ used in a measurement of the beat length, $L_{Beat\ 1}$.

$$L_{Pig} < \frac{\lambda_0^2}{\Delta\lambda} \times \frac{L_{Beat\ 1}}{\lambda_{Beat\ 1}} \quad \text{(Equation 1)}$$

A second embodiment of a depolarized laser diode module according to the present invention is a depolarized laser diode module in which the length $L_{Pig}$ of the polarization maintaining fiber is expressed by equation 2 or 3.

$$L_{Pig} = \frac{1}{4} \times \frac{\lambda_0^2}{\Delta\lambda} \times \frac{L_{Beat\ 1}}{\lambda_{Beat\ 1}} \quad \text{(Equation 2)}$$

-continued $$L_{Pig} = \frac{3}{4} \times \frac{\lambda_0^2}{\Delta\lambda} \times \frac{L_{Beat\,1}}{\lambda_{Beat\,1}} \quad \text{(Equation 3)}$$

A third embodiment of a depolarized laser diode module according to the present invention is a depolarized laser diode module in which the length $L_{Pig}$ of the polarization maintaining fiber is equal to or larger than a length in which there is no fluctuation of an extinction ratio.

A fourth embodiment of a depolarized laser diode module according to the present invention is a depolarized laser diode module comprising:

a laser diode module having one laser diode and one polarization maintaining fiber which is connected to an output side of the laser diode and;

a depolarizer connected to said laser diode module, wherein a length $L_{Depo}$ of the depolarizer is a value obtained by calculation of equation 4 with use of a longitudinal mode spacing $\Delta\lambda$ of output light from the laser diode, an oscillating center wavelength $\lambda_0$ of the laser light, a beat length $L_{Beat\,2}$ of a birefringent material used in said depolarizer and an optical wavelength $\lambda_{Beat\,2}$ used in a measurement of the beat length, $L_{Beat\,2}$.

$$L_{Depo} < \frac{\lambda_0^2}{\Delta\lambda} \times \frac{L_{Beat\,2}}{\lambda_{Beat\,2}} \quad \text{(Equation 4)}$$

A fifth embodiment of a depolarized laser diode module according to the present invention is a depolarized laser diode module in which the length $L_{Depo}$ of the depolarizer is expressed by equation 5.

$$L_{Depo} = \frac{1}{2} \times \frac{\lambda_0^2}{\Delta\lambda} \times \frac{L_{Beat\,2}}{\lambda_{Beat\,2}} \quad \text{(Equation 5)}$$

A sixth embodiment of a depolarized laser diode module according to the present invention is a depolarized laser diode module in which the length $L_{Depo}$ of the depolarizer is calculated by equation 6 with use of a spectrum FWHM (full width half maximum) $\delta\lambda_{FWHM}$ of said laser diode module and a target DOP value.

$$L_{Depo} \geq \frac{1}{\pi} \times \frac{\left(\lambda_0 - \frac{1}{2}\delta\lambda_{FWHM}\right)\left(\lambda_0 + \frac{1}{2}\delta\lambda_{FWHM}\right)}{\delta\lambda_{FWHM}} \times \frac{L_{Beat2}}{\lambda_{Beat2}} \times \text{Log}_e\left(\frac{DOP}{100}\right) \quad \text{(Equation 6)}$$

A seventh embodiment of a depolarized laser diode module according to the present invention is a depolarized laser diode module in which a length $L_{Pig}$ of the polarization maintaining fiber is expressed by equation 7.

$$L_{Pig} \leq \frac{3}{2} \times L_{Depo} \times \frac{L_{Beat\,1}}{\lambda_{Beat\,1}} \times \frac{\lambda_{Beat\,2}}{L_{Beat\,2}} \quad \text{(Equation 7)}$$

An eighth embodiment of a depolarized laser diode module according to the present invention is a depolarized laser diode module in which a length $L_{Pig}$ of the polarization maintaining fiber is expressed by equation 8.

$$L_{Pig} = \frac{1}{2} \times L_{Depo} \times \frac{L_{Beat\,1}}{\lambda_{Beat1}} \times \frac{L_{Beat\,2}}{\lambda_{Beat\,2}} \quad \text{(Equation 8)}$$

A ninth embodiment of a depolarized laser diode module according to the present invention is a depolarized laser diode module in which a Fiber Bragg Grating is formed in the polarization maintaining fiber.

A tenth embodiment of a depolarized laser diode module according to the present invention is a depolarized laser diode module in which a polarization maintaining fiber for depolarization is used as the depolarizer.

An eleventh embodiment of a depolarized laser diode module according to the present invention is a depolarized laser diode module in which the polarization maintaining fiber at the output side of the laser diode and the polarization maintaining fiber for depolarization are fusion spliced in such a way that optical principal axes of the polarization maintaining fiber and the polarization maintaining fiber for depolarization form an angle of 45°.

A twelfth embodiment of a depolarized laser diode module according to the present invention is a depolarized laser diode module in which used as the depolarizer is a Lyot type consists of spliced two polarization maintaining fibers with a length of $L_{Depo}$ and $2 \times L_{Depo}$ respectively in such a way that an angle of optical principal axes of the polarization maintaining fibers is set at 45°.

A thirteenth embodiment of a depolarized laser diode module according to the present invention is a depolarized laser diode module in which a birefringent crystal is used as the depolarizer.

A fourteenth embodiment of a depolarized laser diode module according to the present invention is a depolarized laser diode module in which the polarization maintaining fiber at the output side of the laser diode and the birefringent crystal are spliced in such a manner that an angle of principal axes of the polarization maintaining fiber and the birefringent crystal is set at 45°.

A fifteenth embodiment of a depolarized laser diode module according to the present invention is a depolarized laser diode module in which a polarization direction of laser light inputted to the birefringent crystal is adjusted by inserting a λ/2 wavelength plate at an input side of the birefringent crystal.

A sixteenth embodiment of a depolarized laser diode module according to the present invention is a depolarized laser diode module in which the configuration of the birefringent crystals is a Lyot type depolarizer.

A seventeenth embodiment of a depolarized laser diode module according to the present invention is a depolarized laser diode module in which an extinction ratio of laser light output from the polarization maintaining fiber of said laser diode module is equal to or more than 15 dB.

An eighteenth embodiment of a depolarized laser diode light source according to the present invention is a depolarized laser diode light source comprising:

a laser light source having a plurality of said laser diode modules and a polarization beam combiner for polarization beam combining; and one depolarizer being arranged at an output side of the polarization beam combiner.

A nineteenth embodiment of an optical amplifier according to the present invention is an optical amplifier which uses said depolarized laser diode light source as a pump light source.

A twentieth embodiment of a Raman amplifier according to the present invention is a Raman amplifier which uses said depolarized laser diode light source as a pump light source.

DETAILED DESCRIPTION OF THE INVENTION

With reference to the accompanied drawings, embodiments of a depolarized laser diode module and a depolarized laser diode light source of the present invention will be described in detail below.

Figure 1:
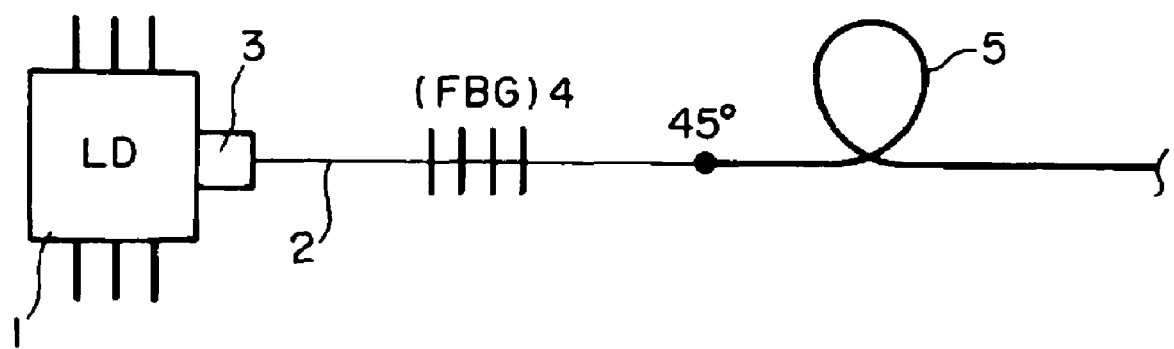
FIG. 1 is an explanatory view of a depolarized laser diode module.

FIG. 1 shows an embodiment of a depolarized laser diode module which utilizes a polarization maintaining fiber as a depolarizer. The depolarized laser diode module includes: a laser diode module which has a laser diode 1 and a polarization maintaining fiber 2 arranged at the output side thereof; and a depolarizer which utilizes a polarization maintaining fiber for depolarization 5. The laser diode 1 and the polarization maintaining fiber 2 are combined by an optical combining part 3. In the polarization maintaining fiber 2, a Fiber Bragg Grating (FBG) 4 is formed.

This polarization maintaining fiber 2 and the polarization maintaining fiber for depolarization 5 are usually fusion-spliced in such a manner that principal axes thereof form an angle of 45°.

In this depolarized laser diode module, the length $L_{Depo}$ of a birefringent optical fiber for depolarization and the length $L_{Pig}$ of the polarization maintaining fiber at the output side of the laser diode module are optimized to reduce DOP fluctuations depending on the temperature and to achieve a stable DOP value, and further to attain a 10% or less DOP value that was difficult to achieve. Focusing on these advantages, the present invention provides such an optimizing method and an optimized depolarized laser diode module. This optimization is performed by the use of an oscillating center wavelength $\lambda_0$ of laser light, a longitudinal mode spacing $\Delta\lambda$ of Fabry-Pérot (FP) of laser light, an oscillating spectrum FWHM $\delta\lambda_{FWHM}$ of laser light, the angle $\theta$ formed by the polarization direction (generally, linear polarization) of laser light output from a laser diode and the principal axis of a polarization maintaining fiber at the output side thereof (hereinafter referred to as "output-side polarization maintaining fiber"), the beat length $L_{Beat\ 1}$ of the output-side polarization maintaining fiber of laser light, the optical wavelength $\lambda_{Beat\ 1}$ used for measuring the beat length, the beat length $L_{Beat\ 2}$ of a polarization maintaining fiber for depolarization and the optical wavelength $\lambda_{Beat\ 2}$ used for measuring the beat length, the angle $\phi$ formed by the principal axis of the output-side polarization maintaining fiber and the principal axis of the polarization maintaining fiber for depolarization.

Figure 2A:
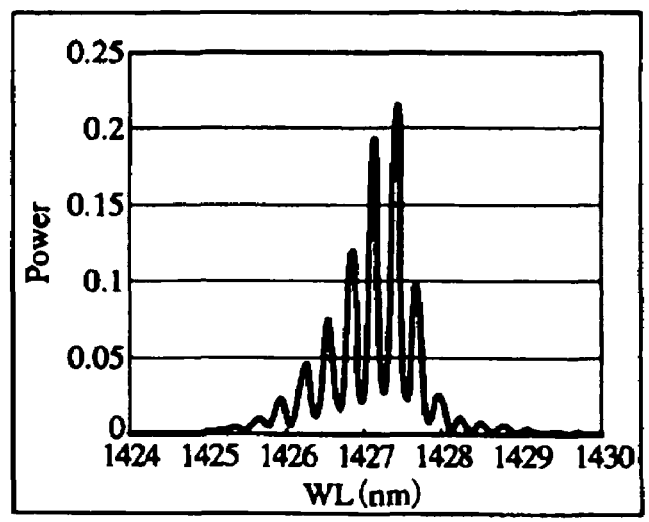
FIG. 2A is a graph for showing an LD spectrum when $\Delta\lambda=0.29$ nm.
Figure 2B:
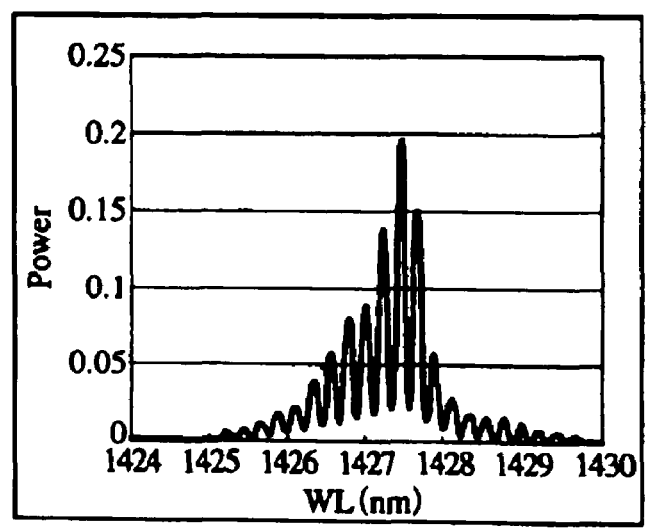
FIG. 2B is a graph for showing an LD spectrum when $\Delta\lambda=0.25$ nm.
Figure 2C:
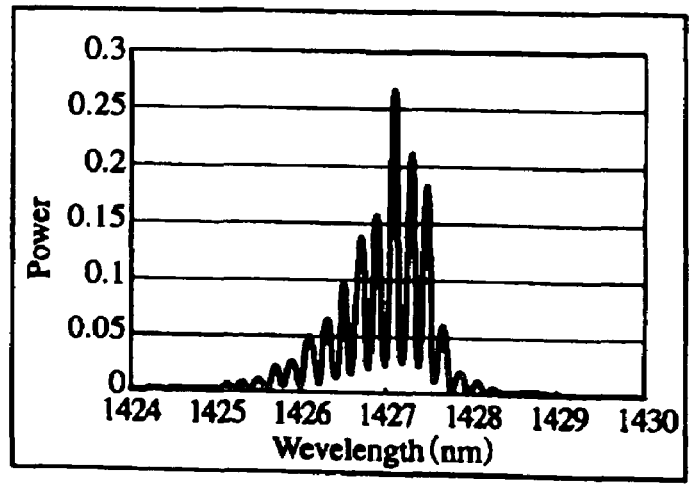
FIG. 2C is a graph for showing an LD spectrum when $\Delta\lambda=0.20$ nm.
Figure 3A:
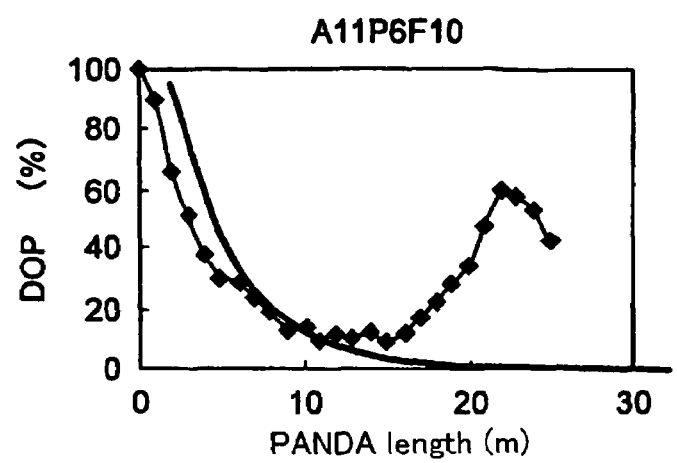
FIG. 3A is a graph for showing relationship between DOP and the length of a polarization maintaining fiber (PANDA: Polarization-maintaining AND Absorption-reducing optical fiber) when $\Delta\lambda=0.29$ nm.
Figure 3B:
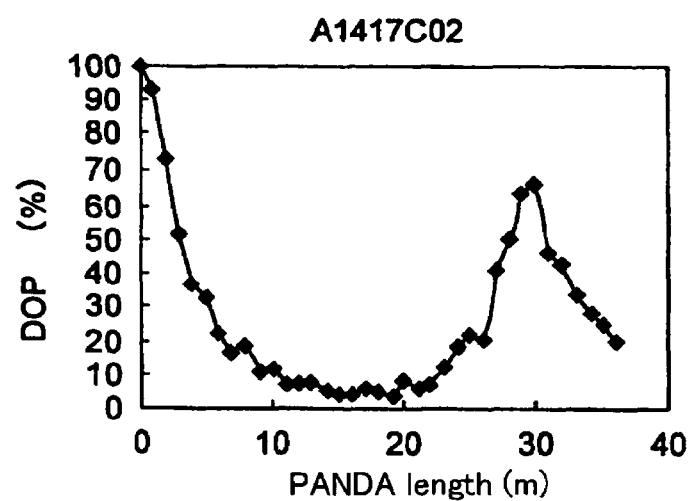
FIG. 3B is a graph for showing relationship between DOP and the length of a polarization maintaining fiber when $\Delta\lambda=0.25$ nm.
Figure 3C:
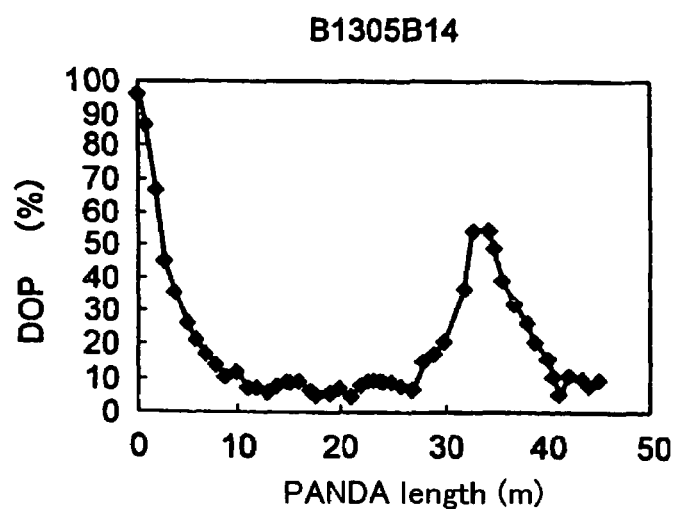
FIG. 3C is a graph for showing relationship between DOP and the length of a polarization maintaining when $\Delta\lambda=0.20$ nm.

FIGS. 2A to 2C show three LD spectra having difference FP mode spacings. Light beams output from the laser diode modules shown in FIGS. 2A to 2C are depolarized with use of an polarization maintaining fiber for depolarization having the beat length $L_{Beat\ 2}$ of 5.2 mm and the optical wavelength $\lambda_{Beat\ 2}$ of 1,550 nm, which results are shown in FIGS. 3A to 3C. Specifications of the laser diode modules shown by FIGS. 2A to 2C are shown in the table 1 below.

TABLE 1

|  | (a) | (b) | (c) |
| --- | --- | --- | --- |
| Δλ | 0.29 nm | 0.25 nm | 0.20 nm |
| FWHM | 0.85 nm | 0.75 nm | 0.85 nm |
| $\lambda_0$ | 1427.32 nm | 1427.75 nm | 1427.20 nm |
| Extinction ratio | 27.9 dB | 24.0 dB | 27.0 dB |

As seen in FIGS. 3A to 3C, the longer the polarization maintaining fiber for depolarization is, the smaller a DOP value becomes. When the birefringent optical fiber for depolarization becomes further longer, the DOP value is increased to become a maximum value. Since this DOP maximum value makes it difficult to design and manufacture a depolarized laser diode module, the present invention is utilized to derive a length of the polarization maintaining fiber for depolarization that corresponds to the maximum DOP value so as to stabilize the DOP value.

Referring to FIGS. 3A to 3C, the length of the polarization maintaining fiber for depolarization that corresponds to the maximum DOP value depends on an FP mode spacing Δλ. The length $L_{peak\ 1}$ of the polarization maintaining fiber for depolarization corresponding to the maximum DOP value is expressed by the following equation.

(Equation 17)

$$L_{peak\ 1} = \frac{(\lambda_0 + \Delta\lambda) \times \lambda_0}{\Delta\lambda} \times \frac{L_{Beat\ 2}}{\lambda_{Beat\ 2}} \approx \frac{\lambda_0^2}{\Delta\lambda} \times \frac{L_{Beat\ 2}}{\lambda_{Beat\ 2}} \quad (3\text{-}1)$$

This equation is described by using an FP mode which matches the oscillating center wavelength $\lambda_0$ and its adjacent FP mode of the wavelength $\lambda_0+\Delta\lambda$ which is Δλ away from the center wavelength. With use of this equation, the length of the polarization maintaining fiber for depolarization that presents the DOP maximum value shown in FIGS. 3A to 3C is calculated. Calculation result and measurement result are shown in the table 2.

Here, (a) to (c) in the table 1 correspond to P-Series to R-Series the table 2, respectively, and they are different in Δλ based on difference in the length of a laser device (cavity length). Accordingly, it depends on Δλ where the DOP maximum value appears in FIGS. 3A to 3C.

TABLE 2

| PMF length at 2nd peak | P-Series | Q-Series | R-Series |
| --- | --- | --- | --- |
| Experiment value | 23 m | 30 m | 34 m |
| Calculated value | 23.88 m | 30.12 m | 33.44 m |
| $L_{depo}$ (calculation) | 11.94 m | 15.06 m | 16.72 m |

The above-shown P-Series to R-Series data present characteristics of the respective Δλs. The difference in cavity length as mentioned above is usually provided to control an optical output from an LD. In the P-Series to R-Series, the P-Series has the shortest cavity length and lowest power and the R-Series has the longest cavity length and highest power.

From the table 2 it is found that the calculation result matches the measurement result and the length of a polarization maintaining fiber for depolarization which corresponds to a DOP maximum value can be derived from the equation (3-1). In the present invention, the equation (3-1) is basically used for designing.

Then, the length $L_{Depo}$ of a birefringent optical fiber for depolarization before the DOP value is increased again can be designed by the following equation (3-1A).

(Equation 17)

$$L_{Depo} \geq \frac{1}{\pi} \times \frac{\left(\lambda_0 - \frac{1}{2}\delta\lambda_{FWHM}\right)\left(\lambda_0 + \frac{1}{2}\delta\lambda_{FWHM}\right)}{\delta\lambda_{FWHM}} \frac{L_{Beat2}}{\lambda_{Beat2}} \times \text{Log}_e\left(\frac{DOP}{100}\right) \quad (3\text{-}2)$$

In the equation, $\delta\lambda_{FWHM}$ represents a full width half maximum of spectrum of light from a laser diode module and DOP is a target DOP value. A profile based on the above equation is shown in FIG. 3A.

Since a spectrum of an actual light source is multi-mode, the DOP characteristic with respect to $L_{Depo}$ reflects a periodic structure of the spectrum. When it is assumed that a spectrum of the light source is a Lorentzian-function-type continuous spectrum, the relationship between $L_{Depo}$ and DOP can be expressed by an index function which shows monotone decreasing as in FIG. 3A. As also seen from FIG. 3A, since the characteristic before the DOP value is increased again is expectable from the multimode envelope shape, the above-mentioned equation is also effective at designing.

As seen from FIGS. 3A to 3C, the DOP value presents a minimum value with a shorter polarization maintaining fiber for depolarization than that given by the equation (3-1). This DOP minimum value is obtained when the length $L_{min}$ of the polarization maintaining fiber for depolarization is expressed by the following equation (3-2).

(Equation 18)

$$L_{min} \approx \frac{1}{2} \times \frac{\lambda_0^2}{\Delta\lambda} \times \frac{L_{Beat2}}{\lambda_{Beat2}} \quad (3\text{-}2)$$

To decrease the DOP value, it is preferable that the length of the birefringent optical fiber for depolarization is set at $L_{min}$ given by the equation (3-2). However, the length may be set at a length corresponding to a DOP value equal to or lower than desired.

This embodiment will be described with use of the length of the polarization maintaining fiber for depolarization given by the equation (3-2).

With a laser diode shown in FIG. 2A taken as an example, the length of a polarization maintaining fiber at the output side of the laser diode is derived.

In deriving the length, the following equation is used to make a numerical calculation.

$$\begin{pmatrix} Exout \\ Eyout \end{pmatrix} = \begin{pmatrix} \exp(i\delta 2) & 0 \\ 0 & 1 \end{pmatrix} \begin{pmatrix} \cos\phi & \sin\phi \\ -\sin\phi & \cos\phi \end{pmatrix} \begin{pmatrix} \exp(i\delta 1) & 0 \\ 0 & 1 \end{pmatrix} \begin{pmatrix} \cos\theta & \sin\theta \\ -\sin\theta & \cos\theta \end{pmatrix} \begin{pmatrix} E(\omega) & \exp(i\omega t) \\ 0 & \end{pmatrix} \quad (3\text{-}3)$$

(Equation 19)

Exout and Eyout represent an x component and a y component, respectively, of the electric field of light output from the depolarizer. δ1 and δ2 represent phase delay differences between lights after propagating on the principal axes of the output-side polarization maintaining fiber and the polarization maintaining fiber for depolarization respectively, and θ represent the angle formed by the polarization direction (generally, linear polarization) of laser light output from the laser diode and the principal axis of the output-side polarization maintaining fiber, and φ represent the angle formed by the principal axis of the output-side polarization maintaining fiber and the principal axis of the polarization maintaining fiber for depolarization. δ1 and δ2 are expressed by the following equations.

(Equation 20)

$$\delta 1 = \frac{L_{Pigtail} \times \lambda_{Beat1}}{L_{Beat1} \times c} \times \omega \quad (3\text{-}4)$$

(Equation 21)

$$\delta 2 = \frac{L_{Depolarizer} \times \lambda_{Beat2}}{L_{Beat2} \times c} \times \omega \quad (3\text{-}5)$$

$L_{Pigtail}$, $L_{Beat\ 1}$, $L_{Depolarizer}$, $L_{Beat\ 2}$ represent a length and a beat length of the output-side polarization maintaining fiber and a length and a beat length of the polarization maintaining fiber for depolarization, respectively. Since these values vary depending on the temperature, the following revisions are required.

(Equation 22)

$$L_{Pigtail}(t) = (\alpha_1 \times t + 1) \times L_{Pigtail0} \quad (3\text{-}6)$$

(Equation 23)

$$L_{Depolarizer}(t) = (\alpha_2 \times t + 1) \times L_{Depolarizer0} \quad (3\text{-}7)$$

(Equation 24)

$$L_{Beat1}(t) = (\beta_1 \times t + 1) \times L_{Beat10} \quad (3\text{-}8)$$

(Equation 25)

$$L_{Beat2}(t) = (\beta_2 \times t + 1) \times L_{Beat20} \quad (3\text{-}9)$$

In the equations, t denotes a temperature, α1 and β1 denote a coefficient of linear expansion of the output-side polarization maintaining fiber and a coefficient of thermal variation of the beat length in linear approximation, and α2 and β2 denote a coefficient of linear expansion of the polarization maintaining fiber for depolarization and a coefficient of thermal variation of the beat length in linear approximation. $L_{Pigtail\ 0}$, $L_{Beat\ 10}$, $L_{Depolarizer\ 0}$ and $L_{Beat\ 20}$ denote a length and a beat length of the output-side polarization maintaining fiber at 0° C. and a length and a beat length of the polarization maintaining fiber for depolarization at 0° C., respectively. $\lambda_{Beat\ 1}$ and $\lambda_{Beat\ 2}$ are wavelengths of light used in measuring beat lengths of the output-side polarization maintaining fiber and the polarization maintaining fiber for depolarization, respectively. ω denotes an angular frequency of the laser light propagating on the principal axes.

With use of Exout and Eyout obtained from the equation 3-3, S0 to S3 which are called Stokes Parameters are obtained from the following equations 3-10 to 3-13.

(Equation 26)

$$S0 = E_{xout}E^*_{xout} + E_{yout}E^*_{yout} \quad (3\text{-}10)$$

(Equation 27)

$$S1 = E_{xout}E^*_{xout} - E_{yout}E^*_{yout} \quad (3\text{-}11)$$

(Equation 28)

$$S2 = E_{xout}E^*_{yout} + E_{yout}E^*_{xout} \quad (3\text{-}12)$$

(Equation 29)

$$S3 = i(E_{xout}E^*_{yout} - E_{yout}E^*_{xout}) \quad (3\text{-}13)$$

Then, the obtained S0 to S3 are substituted into the following equation to obtain a DOP value.

(Equation 30)

$$DOP = \frac{\sqrt{S1^2 + S2^2 + S3^2}}{S0} \times 100 \quad (3\text{-}14)$$

In acquiring a DOP value, the output-side polarization maintaining fiber or the polarization maintaining fiber for depolarization is fixed and the temperature t is changed insofar as the DOP value varies sufficiently to find a maximum DOP value and a minimum DOP value.

Likewise, an extinction ratio of laser light output from the output-side polarization maintaining fiber is calculated by substitution of Ex1 and Ey1 obtained by the following equation 3-15 into the equation 3-16. In calculating the extinction ratio, a maximum value obtained when ψ is changed from 0 to 2π is used and then, the temperature t is changed enough to obtain a maximum value and a minimum value of the extinction ratio.

$$\begin{pmatrix} Ex1 \\ Ey1 \end{pmatrix} = \begin{pmatrix} \cos\varphi & \sin\varphi \\ -\sin\varphi & \cos\varphi \end{pmatrix} \begin{pmatrix} \exp(i\delta1) & 0 \\ 0 & 1 \end{pmatrix} \begin{pmatrix} \cos\theta & \sin\theta \\ -\sin\theta & \cos\theta \end{pmatrix} \begin{pmatrix} E(\omega) & \exp(i\omega t) \\ 0 & \end{pmatrix}$$

(Equation 31) (3-15)

$$\text{Extinction Ratio} = \left| 10 \times \log\left( \frac{|E_{x1}|^2}{|E_{y1}|^2} \right) \right|$$

(Equation 32) (3-16)

Figure 4:
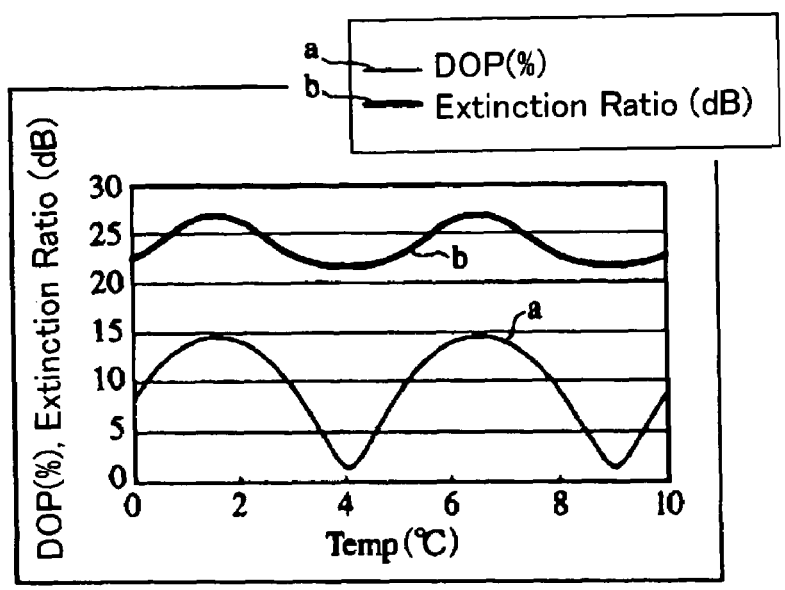
FIG. 4 is a graph for showing temperature dependence of DOP and extinction ratio.

The temperature variation of the extinction ratio is calculated by the use of the equations 3-3 and 3-16, which result is shown in FIG. 4 where the fluctuation of the extinction ratio matches that of DOP. Then, the length of the output-side polarization maintaining fiber is designed such that the fluctuation of the extinction ratio is reduced.

While the length of the polarization maintaining fiber for depolarization is fixed at 12 m and the length of the output-side polarization maintaining fiber is changed, maximum values and minimum values of the extinction ratio and the DOP value are calculated. The calculation results are shown in FIG. 5.

Figure 5:
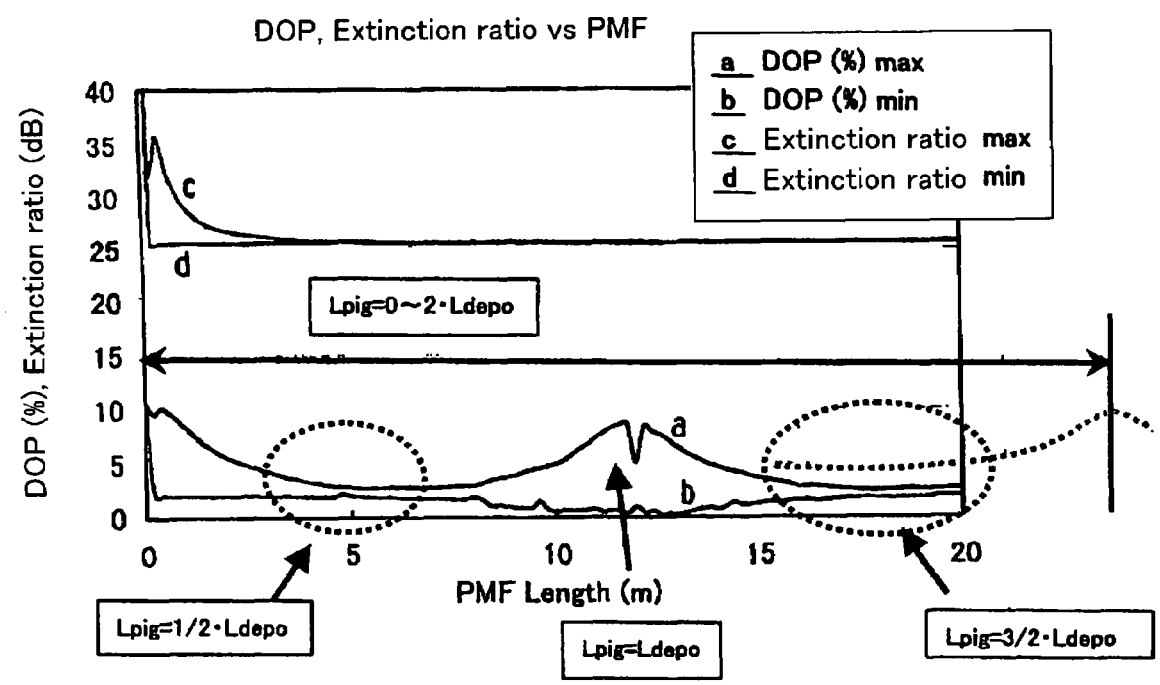
FIG. 5 is a graph for showing relationship between DOP, extinction ratio and the length of a PMF (Polarization Maintaining Fiber)
Figure 6:
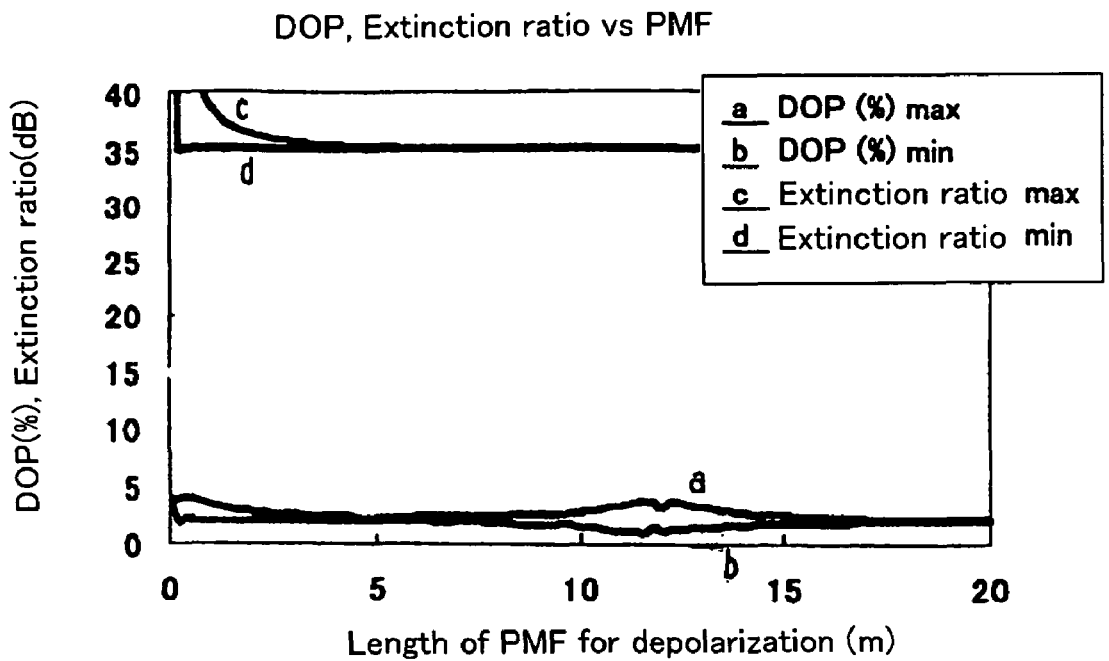
FIG. 6 is a graph for showing relationship between DOP, extinction ratio and the length of a polarization maintaining fiber for depolarization when $\theta=1°$.
Figure 7:
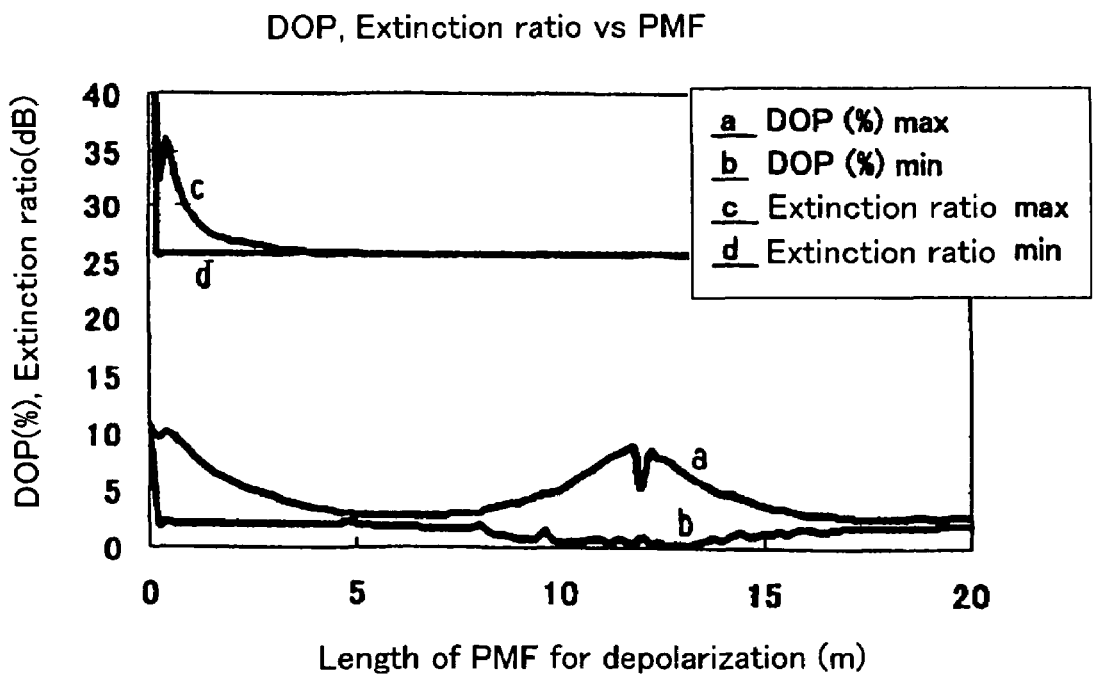
FIG. 7 is a graph for showing relationship between DOP, extinction ratio and the length of a polarization maintaining fiber for depolarization when $\theta=3°$.
Figure 8:
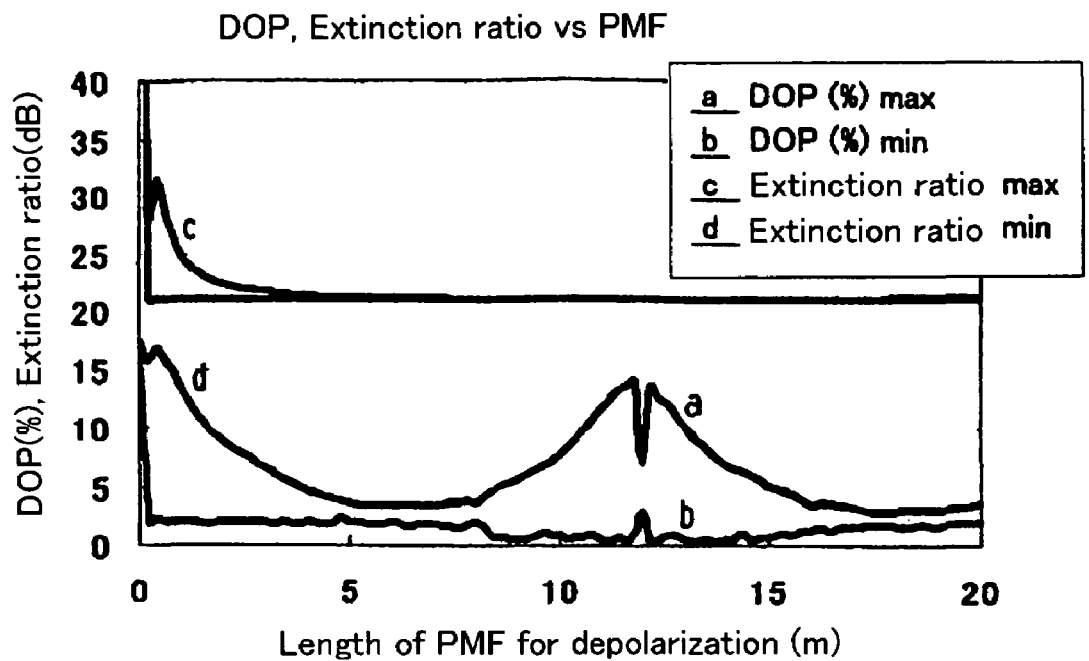
FIG. 8 is a graph for showing relationship between DOP, extinction ratio and the length of a polarization maintaining fiber for depolarization when $\theta=5°$.
Figure 9:
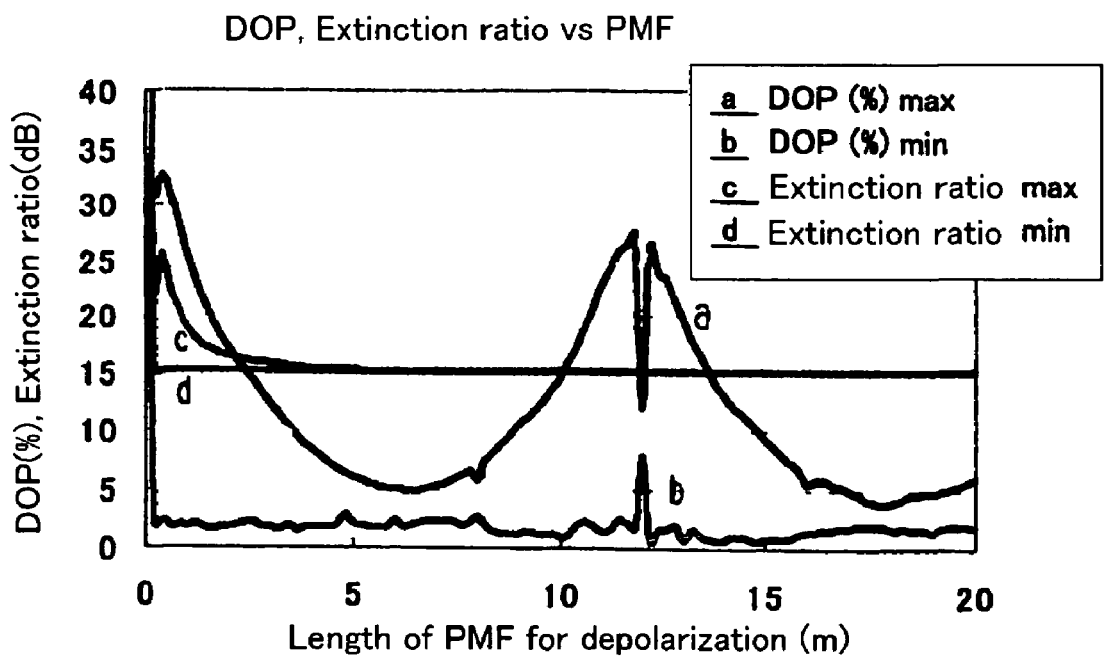
FIG. 9 is a graph for showing relationship between DOP, extinction ratio and the length of polarization maintaining fiber for depolarization when $\theta=10°$.

As seen from FIG. 5, when the beat length of the output-side polarization maintaining fiber is equal to the beat length of the polarization maintaining fiber for depolarization, if the length of the output-side polarization maintaining fiber is half the length of the polarization maintaining fiber for depolarization, the fluctuation is reduced and the maximum value of DOP becomes an extremely small value.

In addition, the beat length of the output-side polarization maintaining fiber exceeds a predetermined length, the extinction ratio does not fluctuate. In fact, when the maximum value of the extinction ratio converges to the minimum value (maximum value–minimum value<0.01 dB), the fluctuation of the extinction ratio is said to disappear. Also as to the length of the output-side polarization maintaining fiber, a difference between a maximum value and a minimum value of DOP is small enough.

Then, a preferable length of the output-side polarization maintaining fiber is a length expressed by the following equation 3-17 or a length of which the maximum value of the extinction ratio converges to the minimum value (in other words, the length such that fluctuation of the extinction ration disappears).

(Equation 33)

$$L_{pig} = \frac{1}{2} \times L_{Depo} \times \frac{L_{Beat1}}{\lambda_{Beat1}} \times \frac{\lambda_{Beat2}}{L_{Beat2}} \quad (3\text{-}17)$$

When $L_{Depo}$ is expressed by the following equation 3-18, the optimal length of the output-side polarization maintaining fiber is obtained by the equation 3-19 by substituting the equation 3-18 for the equation 3-17.

(Equation 34)

$$L_{Depo} = \frac{1}{2} \times \frac{\lambda_0^2}{\Delta\lambda} \times \frac{L_{Beat2}}{\lambda_{Beat2}} \quad (3\text{-}18)$$

(Equation 35)

$$L_{Pig} = \frac{1}{4} \times \frac{\lambda_0^2}{\Delta\lambda} \times \frac{L_{Beat1}}{\lambda_{Beat1}} \quad (3\text{-}19)$$

Further, referring to FIG. 5, since the optimum value of the output-side polarization maintaining fiber is found in the vicinity of $L_{Pig} = 3/2 \times L_{Depo}$, a value obtained by the equation 3-20 may be selected.

(Equation 36)

$$L_{Pig} = \frac{3}{2} \times L_{Depo} \times \frac{L_{Beat1}}{\lambda_{Beat1}} \times \frac{\lambda_{Beat2}}{L_{Beat2}} \quad (3\text{-}20)$$

As in the case with the equation 3-19, the optimal length of the output-side polarization maintaining fiber is obtained by substitution of the equation 3-18 into the equation 3-20.

(Equation 36A)

$$L_{Pig} = \frac{3}{4} \times \frac{\lambda_0^2}{\Delta\lambda} \times \frac{L_{Beat1}}{\lambda_{Beat1}} \quad (3\text{-}20A)$$

As is clear from FIG. 5, a DOP profile is very flat in the vicinity of the optimal optical-fiber length expressed by the equations 3-17 through 3-20A. Therefore, the optimal fiber length can be determined from in a wide range of the vicinity of this optimal fiber length.

Also seen from FIG. 5, the temperature characteristic of DOP appears at $L_{Pig} = L_{Depo}$, and it is clear from the profile of this graph that the next temperature characteristic of DOP appears at $L_{Pig} = 2 \times L_{Depo}$. Accordingly, $L_{Pig}$ can be determined enough by considering the range up to $2 \times L_{Depo}$, and the following equation can be obtained.

(Equation 36B)

$$L_{Pig} < 2 \times L_{Depo} \times \frac{L_{Beat1}}{L_{Beat2}} \times \frac{\lambda_{Beat2}}{\lambda_{Beat1}} \quad (3\text{-}20B)$$

As in the case with the equation 3-19, the optimal length of the output-side polarization maintaining fiber is acquired by substitution of the equation 3-18 into the equation 3-20B.

(Equation 36C)

$$L_{Pig} < \frac{\lambda_0^2}{\Delta\lambda} \times \frac{L_{Beat1}}{\lambda_{Beat1}} \quad (3\text{-}20C)$$

Further by the use of the equations 3-3 and 3-16, relationships between maximum/minimum values of the extinction ratio and DOP maximum/minimum values with the length of the output-side polarization maintaining fiber for several θs are obtained, which result is shown in FIGS. 6 to 9. The smaller θ becomes, the larger the minimum value of the extinction ratio becomes and the smaller the DOP fluctuation becomes.

In view of this result, it becomes possible to decrease the fluctuation while the extinction ratio is increase. The minimum value of the extinction ration of the laser diode module output light is preferably 15 dB or more, and the larger it is, the better. When two laser diodes of different extinction ratios are used, the length of the polarization maintaining fiber for depolarization is determined by the equation 3-18 and the length of the output-side polarization maintaining fiber is set at 1 m, the temperature change for DOP is shown in FIGS. 10A and 10B.

Figure 10B:
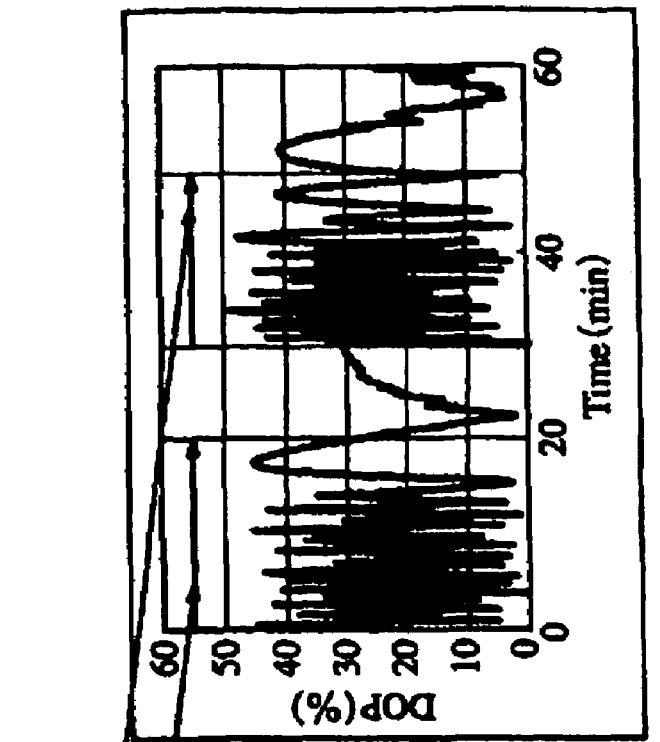
FIG. 10B is a graph for showing temperature dependence of DOP when the extinction ratio is 10.4 dB.
Figure 10A:
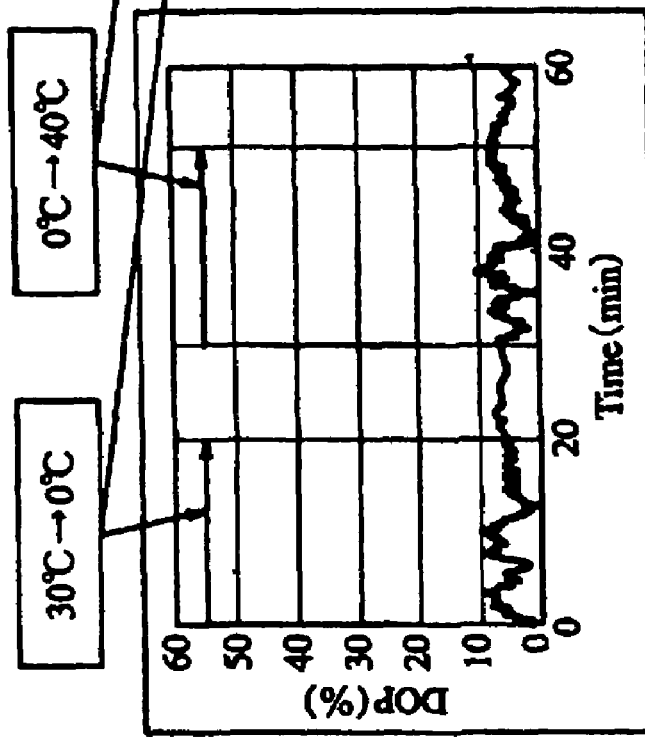
FIG. 10A is a graph for showing temperature dependence of DOP when the extinction ratio is 27.9 dB.

As seen in FIGS. 10A and 10B, when the output-side polarization maintaining fiber is short and equal, the larger the extinction ration is, the smaller the DOP maximum value and the DOP fluctuation become.

Figure 11:
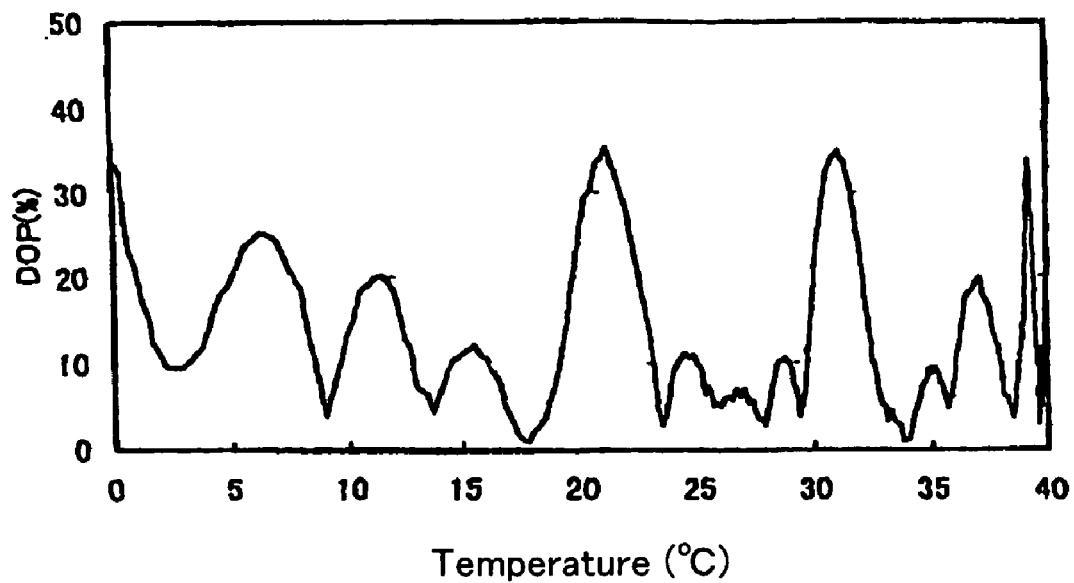
FIG. 11 is a graph for showing temperature dependence of DOP.
Figure 12:
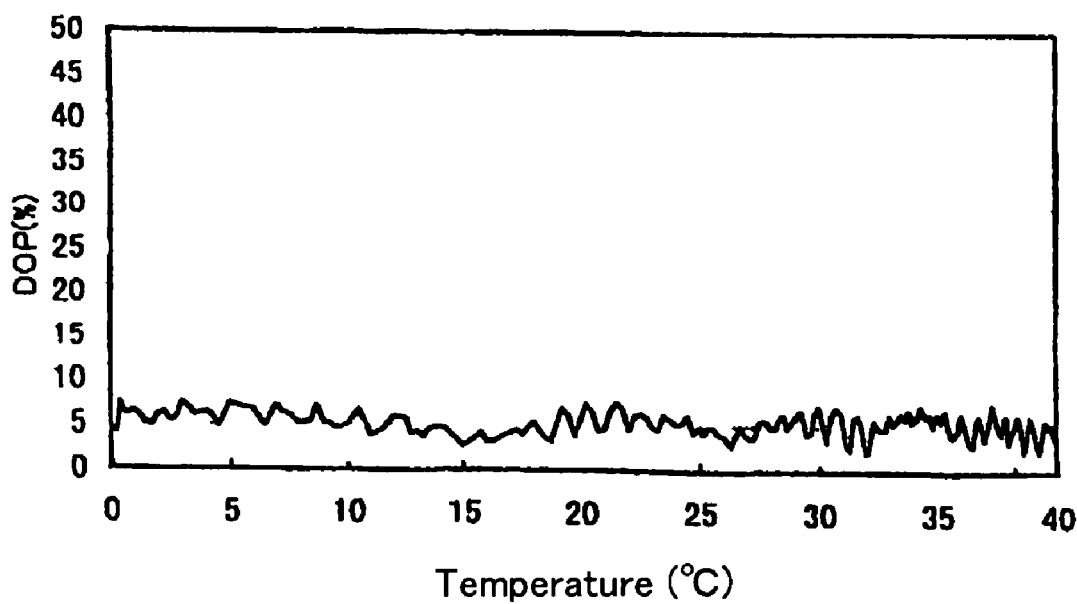
FIG. 12 is a graph for showing temperature dependence of DOP.
Figure 13:
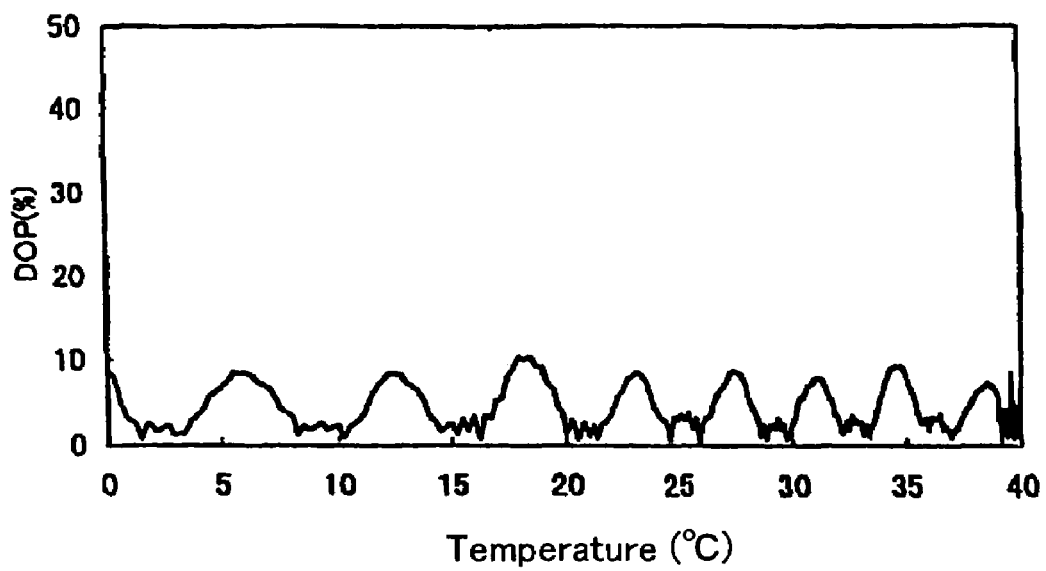
FIG. 13 is a graph for showing temperature dependence of DOP.
Figure 14:
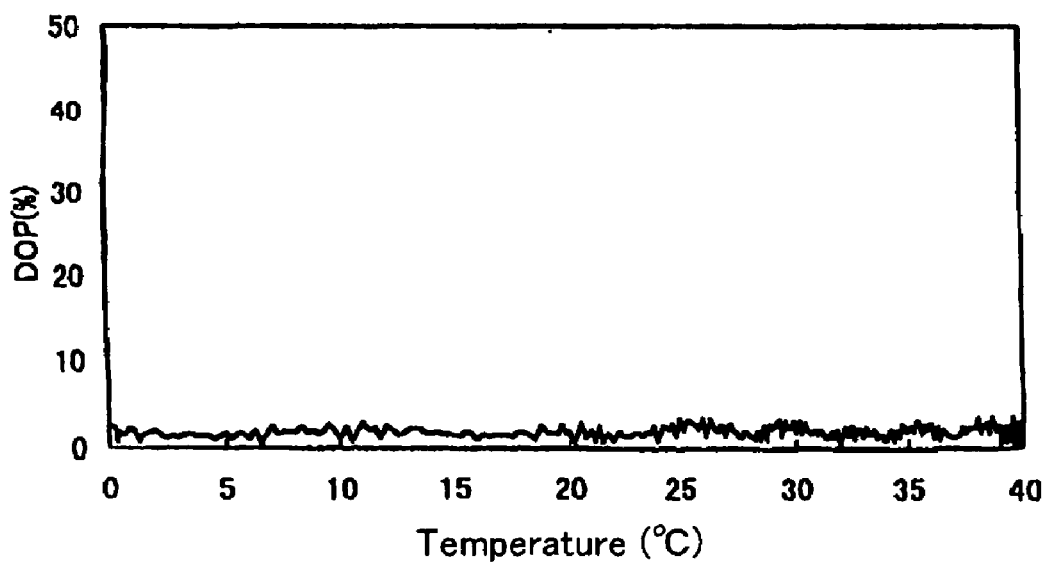
FIG. 14 is a graph for showing temperature dependence of DOP.

With use of these designing methods described above, the length of the polarization maintaining fiber for depolarization is set at a length expressed by the equation 3-18 and the length of the outputting polarization maintaining fiber is set at 1 m or a length expressed by the equation 3-19, and then, the temperature change for DOP is measured. Measurement result is shown in FIGS. 11 and 12.

The calculation result is in good agreement with the experimental result, and when the length of the output-side polarization maintaining fiber is optimized, the DOP fluctuation dependent on the temperature almost disappears.

Further, when the polarization maintaining fiber for depolarization is utilized in a depolarizer of a depolarized laser diode module, another embodiment can be conceived such that the depolarized laser diode module adopts a Lyot type depolarizer in which the polarization maintaining fiber for depolarization with the length of $L_{Depo}$ and the polarization maintaining fiber for depolarization with the length of $2 \times L_{Depo}$ are spliced in such a manner that their optical principal axes form an angle of 45°.

Generally, a Lyot type depolarizer is used as means for depolarizing any polarized incident light. Therefore, if the designing according to the present invention is applied to the Lyot type depolarizer, it is possible, regardless of the state of polarization of output light from a laser diode module, to achieve a DOP value of which the maximum value is small and the temperature-dependent fluctuation is minimized. In other words, as described above, if the Lyot type depolarizer consisting of combined polarization maintaining fibers for depolarization is designed and manufactured in advance, even when it is attached to a laser diode module with a polarization maintaining fiber of any length arranged at the output side thereof, there is a merit of benefiting from the predetermined effect.

Figure 15:
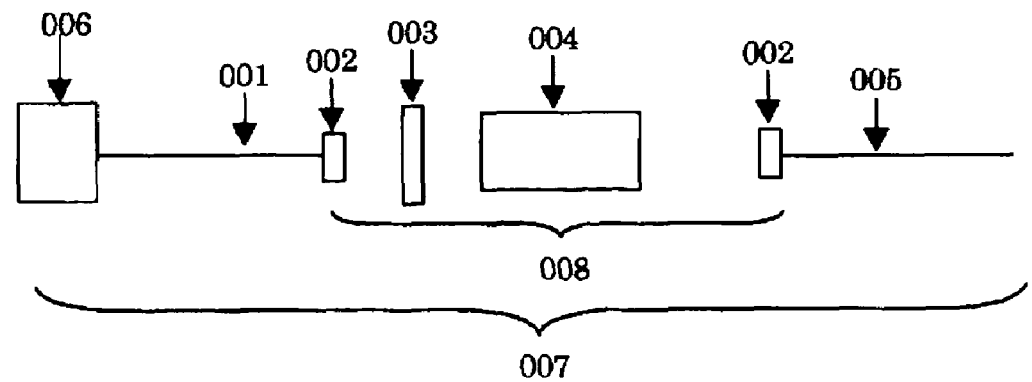
FIG. 15 is an explanatory view for illustrating a depolarized semiconductor laser diode module.

Next, FIG. 15 shows an embodiment of the depolarized laser diode module when a birefringent crystal is used in a depolarizer.

A polarization maintaining fiber 001 for propagating light output from a laser diode 006 is connected to the output side of the laser diode, and connected to this polarization maintaining fiber 001 is a birefringent crystal (depolarizer) 004. Since the output light from the polarization maintaining fiber 001 can not be input directly to the birefringent crystal (depolarizer) 004, they are connected by an optical combiner 002 consisting of a collimator and the like.

A polarizer 003 is shown in FIG. 15. However, this polarizer 003 is not necessary when the polarization maintaining fiber 001 is designed by the above-described designing method.

Accordingly, the depolarized laser diode module including: the laser diode module which has the laser diode 006 and the polarization maintaining fiber 001; and the birefringent crystal (depolarizer) 004 connected by the optical combiner 002 is conceived as an embodiment. In this case, the polarization maintaining fiber 001 and the birefringent crystal (depolarizer) 004 are connected by the optical combiner 002 in such a manner that their optical principal axes form an angle of 45°.

When a $\lambda/2$ wavelength plate is inserted at the incident side of the birefringent crystal (depolarizer) 004, it is possible to rotate the polarization direction of the laser light by 45°. Therefore, differently from the above-described case, it is possible to arrange the outputting polarization maintaining fiber 001 and the birefringent crystal 004 in such a direction that their optical principal axes are matched.

Next description will be made about the case when a polarizer 003 is provided. In this case, the length of the polarization maintaining fiber 001 can be freely determined.

FIG. 15 shows an example of a depolarized laser diode module 007 in which a polarization control part is arranged. This depolarized laser diode module 007 includes: a laser diode 006; a polarization maintaining fiber 001 provided at the output side of the laser diode 006 for propagating light output from the laser diode 006; and a polarization control part 008 connected to the polarization maintaining fiber 001. This polarization control part 008 has an incident end and an outgoing end, each of which is connected to an optical combiner 002, and between the both optical combiners 002 the polarizer 0003 and the birefringent crystal (depolarizer) 004 are arranged in line. The polarization maintaining fiber 001 is used between the laser diode 006 and the fiber-001-side optical combiner, while a standard single mode fiber (SMF) is used as an optical fiber 005. The above-mentioned optical combiners 002 are realized mainly by collimators, and the polarizer 003 and the birefringent crystal 004 are composed of YVO4, LiNbO3, calcite, rutile or the like.

Arrangement is made such that the polarization direction of the polarizer 003 matches the polarization direction of the incident light and forms an angle of 45° with respect to the optical principal axis of the birefringent crystal. This is for the purpose of making the state of polarization of laser light input to the birefringent crystal 004 linear and stabilized to form an angle of 45° with respect to the optical principal axis. Since the laser light output from the laser diode 006 passes through the polarizer 003, it is possible to reduce the temperature-dependent DOP fluctuation of the polarization state of the laser light.

Figure 16:
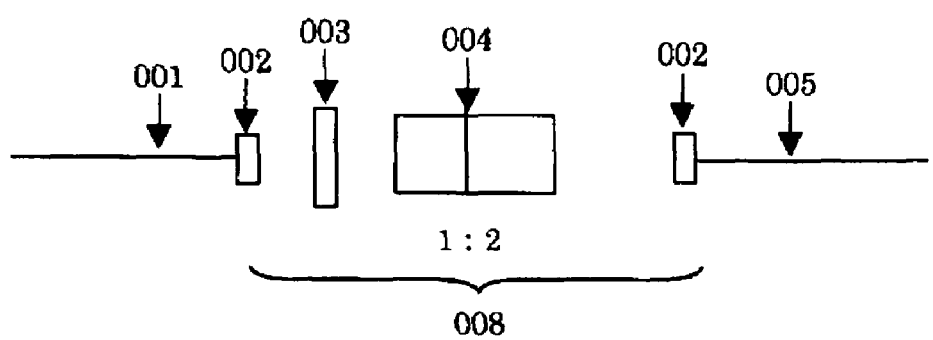
FIG. 16 is a view for explaining an embodiment of a polarization controlling part arranged in a depolarized semiconductor laser diode module.

FIG. 16 shows an embodiment of the polarization control part 008 arranged in the depolarized laser diode module. In the polarization control part 008 in FIG. 16, the birefringent crystal (depolarizer) 004 consists of two birefringent components, which is different from that shown in FIG. 15. In the case of FIG. 16, the two birefringent components are arranged in such a way that their optical principal axes form an angle of 45°. In addition, the polarizer 003 is preferably arranged in such a manner that its polarization direction forms an angle of 0° with respect to the polarization direction of incident light and the optical principal axis of the first birefringent crystal (depolarizer) 004 component. Here, the birefringent crystal depolarizer is Lyot type of which the length ratio in the light propagating direction of the two components is 1 to 2.

When the polarization maintaining fiber 001 is set by the above-described designing method, the polarizer 003 is unnecessary also in this Lyot type depolarizer.

For the depolarized laser diode module 007 according to the present invention, since propagated laser light is usually input in linear polarization state to a birefringent component by the polarizer 003, it is not subjected to influence of polarization crosstalk. In addition, even if the state of polarization of the laser light varies due to vibration or temperature change, it is possible to output laser light having a stabilized low DOP by passing through the polarizer.

Figure 17:
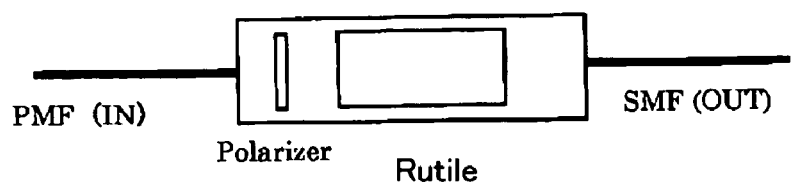
FIG. 17 is a block diagram of a crystal type depolarizer.

Characteristics of a depolarizer using a birefringent crystal as the depolarizer 004 are evaluated. A configuration of the crystal depolarizer is shown in FIG. 17. The principal axis of the polarization maintaining fiber (PMF) and the polarization axis of the polarizer are matched, and the principal axis of a rutile is 45° turned and fixed with respect to the polarization axis of the polarizer. The rutile is set to have a length corresponding to an LD of the Q series by using the designing method of fiber-type depolarizers. Since the polarizer is arranged upstream from the crystal, polarization of the laser light input to the crystal is always made linear thereby to remove DOP variation due to variation of the polarization state of a PMF output caused by temperature change.

Figure 18:
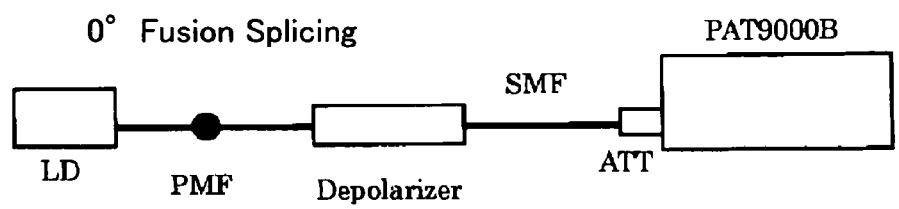
FIG. 18 is a view for explaining a measuring system for characteristic evaluation of a depolarizer.

A measurement system for characteristic evaluation of the aforementioned depolarizer is shown in FIG. 18, in which a Q series LD having a FBG with a wavelength of 1461.9 nm and an FWHM of 0.8 nm is used. The PMF at the output side of the LD and a PMF at the input side of the depolarizer are fusion-spliced in such a manner that their principal axes are in agreement. Relationship between DOP and current values and DOP temperature dependence with LD current value set at 800 mA are evaluated.

Figure 19:
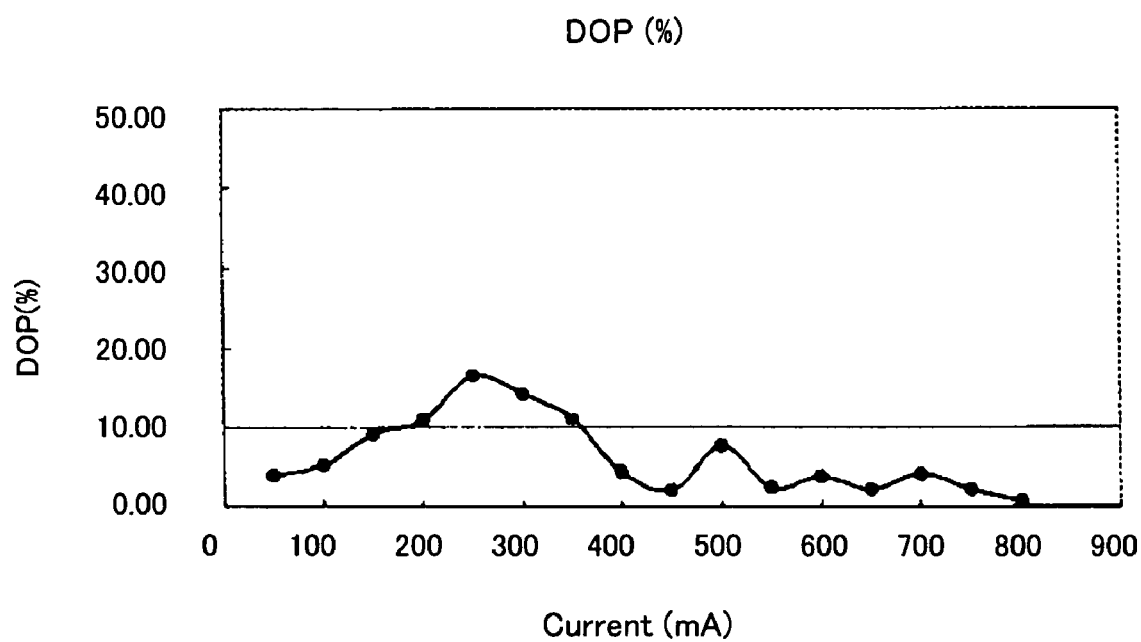
FIG. 19 is a graph for showing current dependence of DOP.
Figure 20:
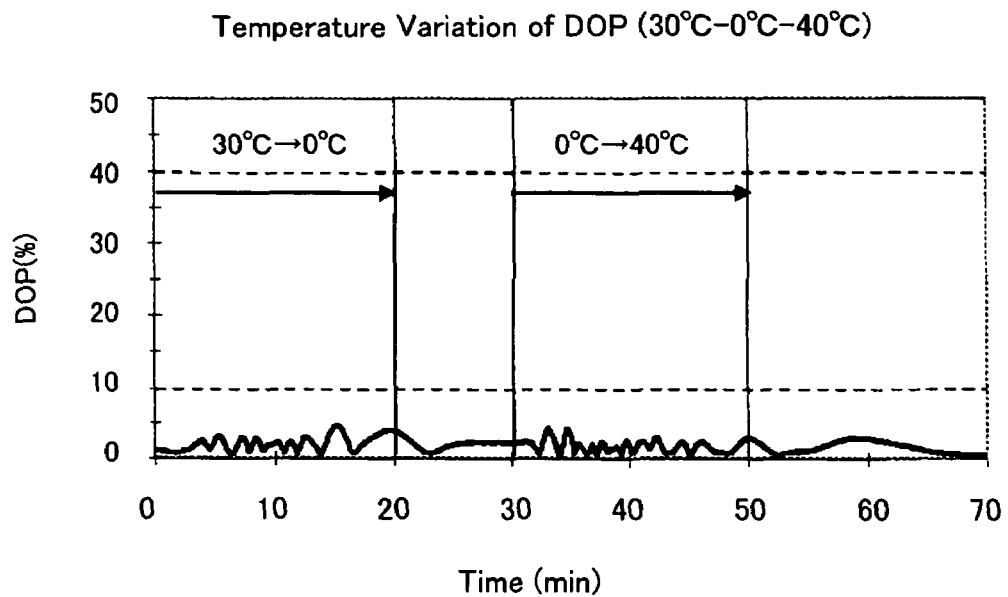
FIG. 20 is a view for showing temperature dependence of DOP.

The relationship of DOP with current values and DOP temperature dependence are shown in FIGS. 19 and 20, respectively. In the relationship between DOP and current values, DOP presents a maximum value of 16.5% when the current value is 250 mA. The more the current value is increased, the less DOP becomes, and when the current value is 400 mA or more, DOP becomes below 10%. In the evaluation of DOP temperature dependence, DOP varies as the temperature varies, and DOP presents an excellent result of maximum value of 4.5%.

Such an evaluation as described above is made then about a depolarizer which is manufactured by using a rutile of which the length is determined by the same designing method as that of the fiber-type depolarizer and arranging a polarizer upstream from the rutile to reduce DOP temperature-dependent variation. Evaluation results show that when the current value is 400 mA or more, DOP presents 10% or less. Then, when the temperature dependence is measured at the current value of 800 mA, a stable low DOP value of an absolute value of 4.5% or less can be achieved against the temperature fluctuation.

Here, when a birefringent crystal is used in a depolarizer, as is the case with the polarization maintaining fiber for depolarization, a minimum value of the extinction ratio of output light of a laser diode module is preferably 15 dB or more and the larger the minimum value is, the better it is.

By using the above-mentioned PMF length designing method, a plurality of laser diodes can be arranged for use as a depolarized laser diode module. Next description is made about a configuration with which light beams output from the respective laser diodes are combined to be output.

Figure 21:
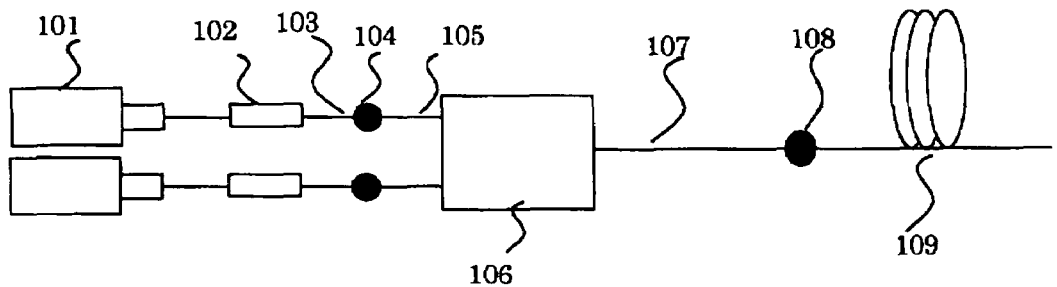
FIG. 21 is a view for explaining a modification of a depolarized laser diode module shown on FIG. 1.

FIG. 21, in which a configuration of a plurality of laser diodes arranged, shows a modification of the embodiment of FIG. 1. 101 depicts pumping laser diode modules, 102 depicts fiber Bragg gratings, 106 depicts a polarization beam combiner or a polarization maintaining beam combiner (hereinafter collectively called "polarization beam combiner") and 109 depicts a depolarizer which consists of a polarization maintaining fiber for depolarization designed to have a length of $L_{Depo}$ as described above.

103 depicts a first polarization maintaining fiber for outputting from the laser diode module 101, 105 depicts a second polarization maintaining fiber for inputting to the polarization beam combiner 106, 104 depicts a junction of the first polarization maintaining fiber 103 and the second polarization maintaining fiber 105, 107 depicts a third polarization maintaining fiber for outputting from the polarization beam combiner 106 and 108 depicts a junction of the third polarization maintaining fiber 108 and the depolarizer 109.

At the junction 108, the third polarization maintaining fiber 107 and a polarization maintaining fiber for depolarization of the depolarizer 109 are jointed in such a manner that their optical principal axes are 45° away from each other. On the other hand, at the junction 104, optical fibers are jointed so that their optical principal axes are matched, and in other words, the optical fibers are jointed to have the optical principal axes forming an angle of 0°.

However, the following configuration may be adopted such that the optical principal axes of the optical fibers jointed at the junction 108 may form an angle of 0°, the optical principal axes of the optical fibers jointed at the junction 104 may be 45° shifted from each other and a free-space optical module composed of multilayer filter is used instead of the polarization beam combiner 106. When light beams output from the laser diodes 101 are depolarized before being combined, a WDM coupler is used. Such WDM couplers include a fiber fused coupler, a Mach Zehnder wavelength multiplexer composed of optical waveguides. When the light beams output from the laser diodes 101 are not depolarized before being combined, the polarization beam combiner 106 is used.

Also usable instead of the polarization beam combiner is a polarization-maintaining wavelength multiplexer.

In FIG. 21, light beams output from at least two laser diode modules 101 having the same or different center wavelengths are propagated through the first polarization maintaining fibers 103 and then through the second polarization maintaining fibers 105 and are combined at the polarization beam combiner 106.

Next, output light from the polarization beam combiner 106 is propagated through the third polarization maintaining fiber 107 and the depolarizer 109 in this order. As a result of this propagation, the DOP of each of the laser diodes can be reduced independently.

Conventionally, when two laser diode modules 101 had the same center wavelength, outputs from the laser diode modules were made equal to realize a low DOP value. However, such a conventional configuration is not required in FIG. 21.

In addition, a low DOP value can be obtained even if two laser diode modules 101 have different center wavelengths. When using the polarization beam combiner 106, the configuration of two laser diode modules 101 arranged is possible, while for using the polarization maintaining multiplexer, it is possible to reduce DOP values of two or more laser diode modules 101 by the single depolarizer 109.

Although the embodiment of FIG. 21 is described with use of the configuration in which the two laser diode modules 101 are arranged, the present invention is not limited to this configuration and a plurality of laser diode modules 101 may be arranged.

According to the configuration on FIG. 21, the DOP of output light from the polarization beam combiner 106 can present a stable low value regardless of temperature fluctuation. For example, the DOP can be stabilized below 10%.

Figure 22:
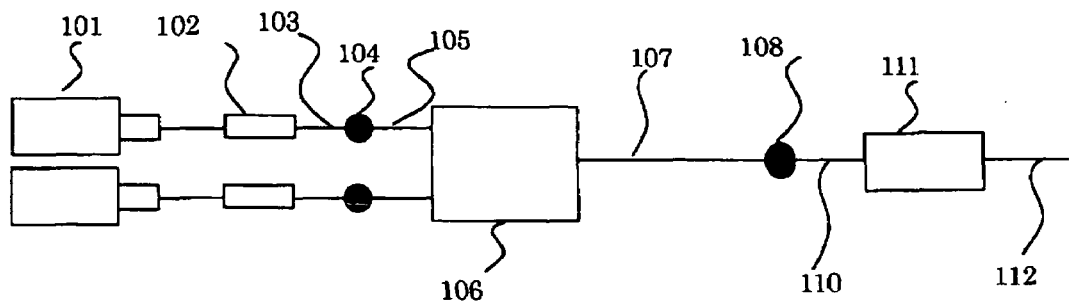
FIG. 22 is a view for explaining a modification of a depolarized laser diode module shown on FIG. 15.

Next description is made about another embodiment of FIG. 21 with reference to FIG. 22. A configuration shown in FIG. 22 is a crystal type depolarizer modified from the depolarizer 109 in FIG. 21. This crystal depolarizer 111 may utilize a configuration of FIG. 15 or 16, for example. Components different from those in FIG. 21 except for the crystal depolarizer 111 are an fourth polarization maintaining fiber 110 for inputting to the crystal depolarizer 111 and an optical fiber 112 for outputting from the crystal depolarizer 111.

As is not shown, the crystal depolarizer 111 includes the fourth polarization maintaining fiber 110, a polarizer of which the polarization direction matches the optical principal axis of the optical fiber 110, a birefringent crystal of which the optical principal axis is 45° shifted from the polarization direction and an optical fiber provided at the output side thereof, and a collimator is arranged at each end surface of the optical fibers.

Also in the configuration of FIG. 22, the same effect can be obtained as that obtained by the configuration of FIG. 21. In addition, since the crystal depolarizer 111 is smaller than the polarization maintaining fiber for depolarization shown in FIG. 21, the configuration is totally downsized.

Figure 23:
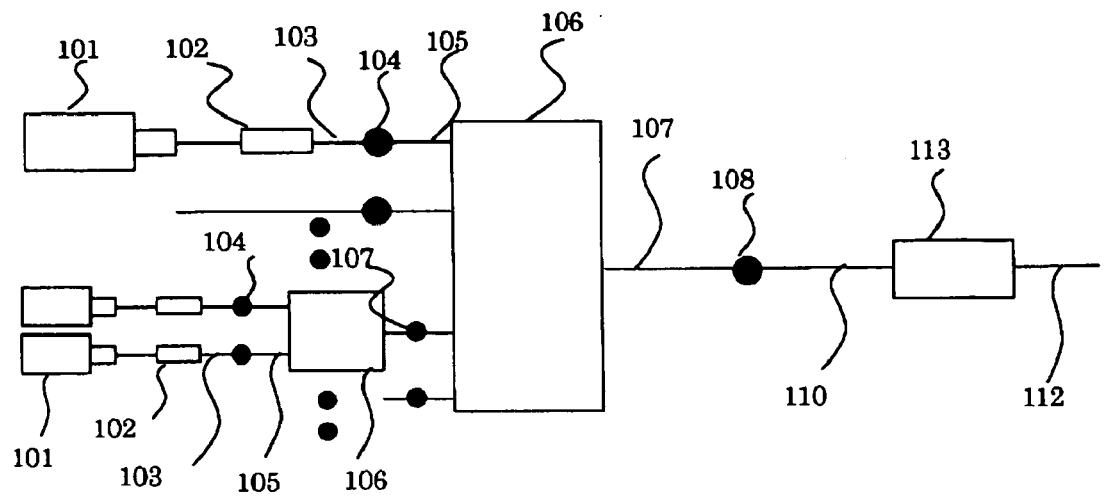
FIG. 23 is a view for explaining an embodiment of a depolarized pump light source which utilizes a depolarized laser diode module of the present invention.

Next, a modification of the embodiments FIGS. 21 and 22 is shown in FIG. 23. FIG. 23 shows an embodiment of a depolarized pump light source.

This depolarized pump light source is a combination of multiple stages, each stage consisting of two laser diode modules shown in FIG. 21.

101 depict pumping laser diode modules, 102 depict Fiber Bragg gratings, 106 depicts a polarization beam combiner, and 113 depicts a crystal depolarizer or a polarization maintaining fiber for depolarization having the designed length of $L_{Depo}$ described above. 103 are first polarization maintaining fibers for outputting from the respective laser diode modules 101, 105 depict second polarization maintaining fibers for inputting to the polarization beam combiner 106, 104 depict junctions between the first polarization maintaining fibers 103 and the respective second polarization maintaining fibers 105, 107 depicts a third polarization maintaining fiber for outputting from the polarization beam combiner 106, and 108 depicts a junction between the third polarization maintaining fiber 107 and a depolarizer 113. At each junction, the optical fibers are jointed in such a manner that their optical principal axes are matched or 45° shifted to each other. This angle is, as described above, determined by whether a polarization beam combiner or a free-space optical module consisted of multiple layer filter is used as optical beam combiner.

The depolarized pump light source on FIG. 23 includes at least three pumping laser diode modules 101 having the same or different center wavelengths, at least two polarization beam combiners 106 and at least one depolarizer 113. According to this depolarized pump light source, since the polarization beam combiners 106 are arranged into different stages and in series, output light beams from the plural laser diode modules 101 are combined, thereby reducing DOP values of all the outputs at once by at least one depolarizer 113.

The depolarizer 113 adopts a fiber-type depolarizer shown on FIG. 21 or a crystal-type depolarizer shown on FIG. 22. In FIG. 23, the at least three laser diode modules 101 having the same or difference center wavelengths are coupled to the polarization beam combiners 106, and outputs from the polarization beam combiners 106 are inputted to the depolarizer 113 via polarization maintaining fibers, thereby to reduce a DOP value of each of the laser diode modules independently. With this configuration, it is possible to reduce respective DOP values of the at least three laser diode modules 101 all at once by the sole depolarizer 113.

Given below are examples of combination of the two polarization beam combiners 106.

(a) The smaller beam combiner 106 is a polarization beam combiner and the larger beam combiner 106 is a polarization maintaining wavelength multiplexer.

(b) The smaller beam combiner 106 is a polarization maintaining wavelength multiplexer and the larger beam combiner 106 is a polarization beam combiner (here, the larger beam combiner 106 is provided with two input ports).

(c) Both of the beam combiners 106 are polarization maintaining wavelength multiplexers.

Polarization beam combiners enable combining regardless of whether wavelengths of the two laser diodes are different or the same. On the other hand, with polarization maintaining wavelength multiplexers, combining is possible only when wavelengths of all the laser diodes are different.

Figure 24:
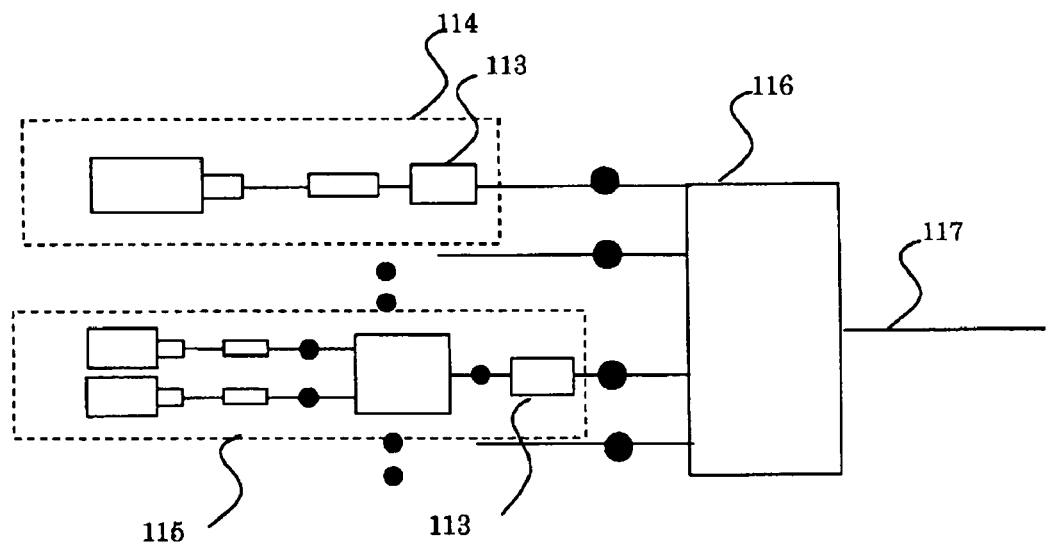
FIG. 24 is a view for explaining an embodiment of a depolarized wavelength division multiplexing pump light source which utilizes a depolarized laser diode module of the present invention.

FIG. 24 shows an embodiment of a depolarized wavelength division multiplexing pump light source. 114 depicts a depolarized laser diode module. 115 depicts a depolarized polarization-beam-combining laser diode module. 116 depicts a WDM coupler and 117 depicts an optical fiber arranged at the output side of the WDM coupler.

The depolarized wavelength division multiplexing pump light source shown in FIG. 24 includes at least one depolarized laser diode module 114, at least one depolarized polarization-beam-combining laser diode module 115 and one WDM coupler 116.

Figure 25A:
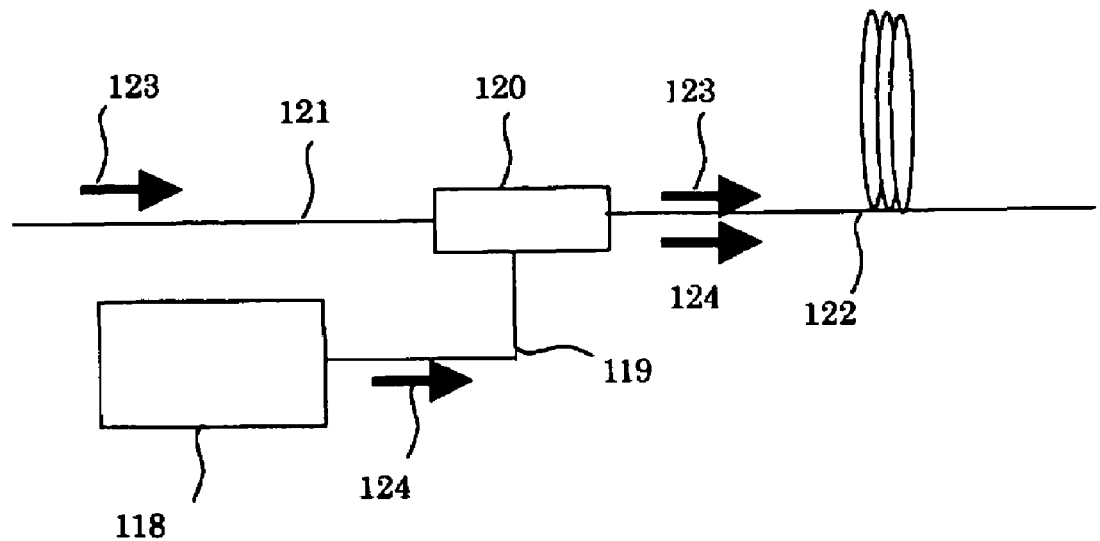
FIG. 25A is a view for explaining an embodiment of a co-pumped Raman amplifier which utilizes a depolarized laser diode module of the present invention.
Figure 25B:
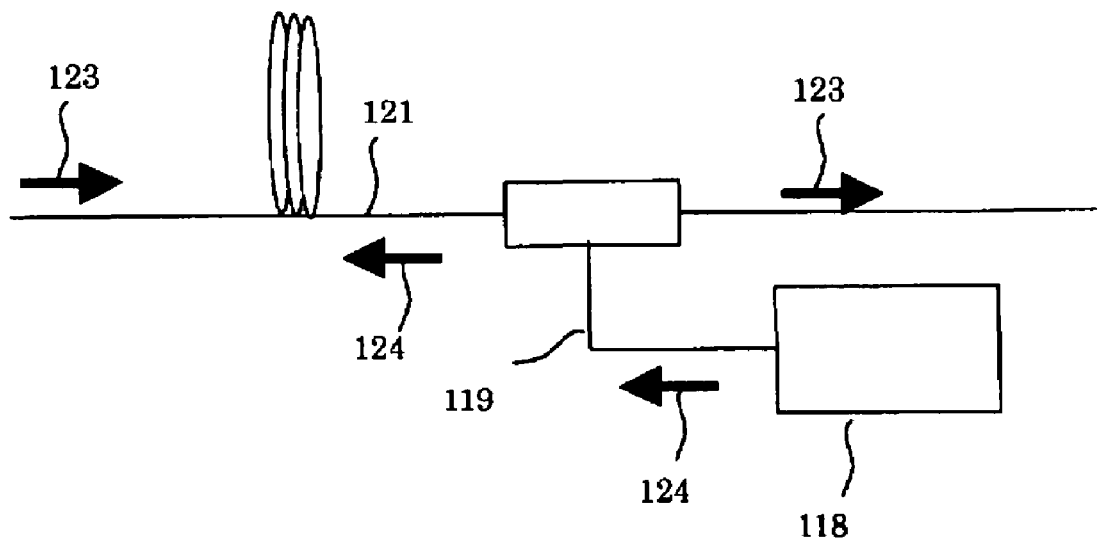
FIG. 25B is a view for explaining an embodiment of a counter-pumped Raman amplifier which utilizes a depolarized laser diode module of the present invention.

Next, FIGS. 25A and 25B show embodiments of a Raman optical amplifier which utilizes a depolarized wavelength division multiplexing pump light source. The amplifier in FIG. 25A is a co-pumped Raman amplifier and the amplifier in FIG. 25B is a counter-pumped Raman amplifier. As is not shown, other than these Raman amplifiers, there is a bi-directional pumped Raman amplifier, which is configured by a combination of Raman amplifiers of FIGS. 25A and 25B. Specifically, it is configured such that pump light is input to a Raman amplification medium from both of an input side and an output side of the Raman amplification medium.

The following explanation is made about the depolarized wavelength division multiplexing pump light source of FIG. 25A. 118 depicts a depolarized pump light source having configurations as shown in FIGS. 21 to 24, 120 depicts a WDM coupler, 121 depicts a signal input port, 119 depicts a pump-light input port, 122 depicts a Raman amplification medium, 123 depicts signal light to be propagated and 124 depicts pump light. The signal light 123 is propagated from a signal transmitter not shown or the like, and this signal light 123 is coupled with the pump light 124 at the WDM coupler 120. The resultant light is input to the Raman amplification medium 122 and thereby, the signal light is amplified.

Figure 26:
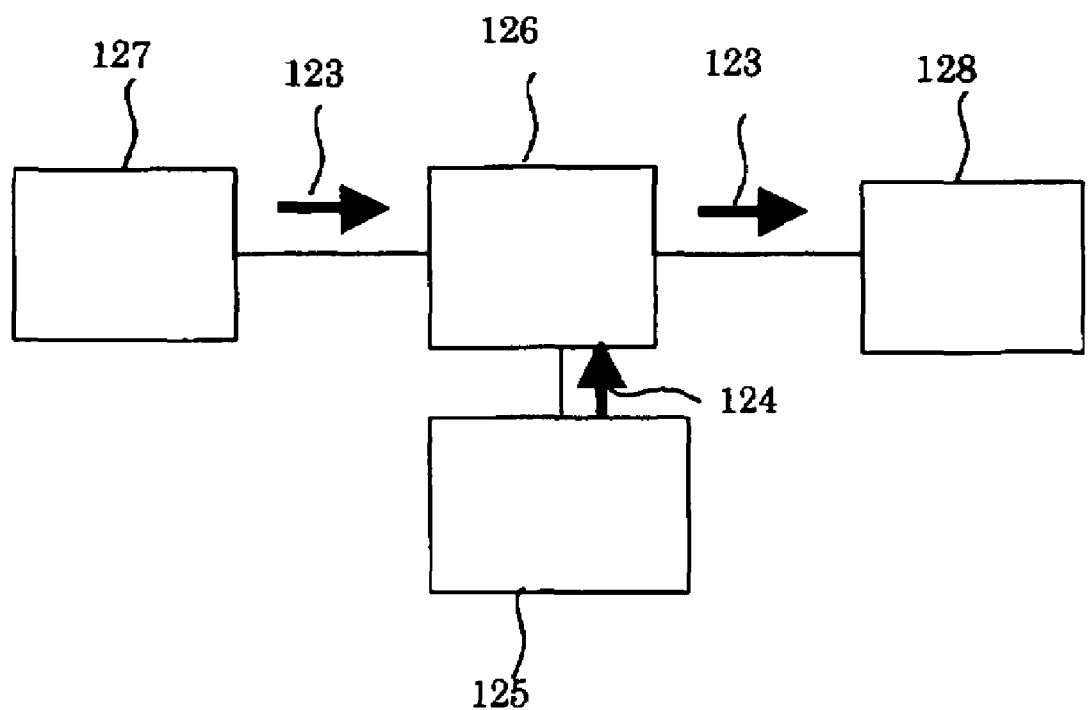
FIG. 26 is a view for explaining an embodiment of a transmission system which utilizes a depolarized laser diode module of the present invention.

FIG. 26 shows an embodiment of a transmission system which utilizes a Raman amplifier using a depolarized wavelength division multiplexing pump light source as shown in FIGS. 25A and 25B. 125 depicts a depolarized wavelength division multiplexing pump light source, 126 depicts a Raman amplification medium, 127 depicts a signal transmitter, and 128 depicts a signal receiver. Signal light 123 is output from the signal transmitter 127, and the signal light 123 and the pump light 124 which is output from the depolarized wavelength division multiplexing pump light source 125 are propagated through the Raman amplification medium 126 and thereby the signal light 123 is amplified and input to the signal receiver 128.

In this embodiment, a Raman optical amplifier using a light source of the present invention is described. The light source of the present invention is also applicable to an EDFA as well as other various optical amplifiers.

In a depolarized laser diode module of the present invention, the length of a polarization maintaining fiber arranged thereof is optimized with use of a cavity length and the oscillating center wavelength of a laser diode, an oscillating spectrum FWHM (full width half maximum), extinction ratio and the beat length of the polarization maintaining fiber, thereby eliminating DOP temperature-dependent fluctuation and stabilizing DOP values and Raman gains. Besides, it is not necessary to manage the ambient temperature of the depolarized laser diode module thereby obtaining handling ease.

Furthermore, in a depolarized polarization laser diode module of the present invention, it is possible to uniquely determine a cavity length and the oscillating center wavelength of a laser diode, an oscillating spectrum FWHM (full width half maximum) and the length of a polarization maintaining fiber for depolarization which has birefringence, thereby facilitating designing and manufacturing of the depolarized laser diode module.

What is claimed is:

1. A depolarized laser diode module comprising:
   a laser diode module having one laser diode and one polarization maintaining fiber which is connected to an output side of the laser diode and;
   a depolarizer connected to said laser diode module,
   wherein a length $L_{Pig}$ of the polarization maintaining fiber is a value obtained by calculation of equation 1 with use of a longitudinal mode spacing $\Delta\lambda$ of output light from the laser diode which is greater than zero, an oscillating center wavelength $\lambda_0$ of the laser light which is greater than zero, a beat length $L_{Beat\ 1}$ which is greater than zero of the polarization maintaining fiber which is greater than zero and an optical wavelength $\lambda_{Beat}$ used in a measurement of the beat length $L_{Beat\ 1}$.

$$L_{Pig} < \frac{\lambda_0^2}{\Delta\lambda} \times \frac{L_{Beat\ 1}}{\lambda_{Beat\ 1}}. \quad \text{(Equation 1)}$$

2. The depolarized laser diode module of claim 1, wherein the length $L_{Pig}$ of the polarization maintaining fiber is expressed by equation 2.

$$L_{Pig} \approx \frac{1}{4} \times \frac{\lambda_0^2}{\Delta\lambda} \times \frac{L_{Beat\ 1}}{\lambda_{Beat\ 1}}. \quad \text{(Equation 2)}$$

3. The depolarized laser diode module of claim 1, wherein the length $L_{Pig}$ of the polarization maintaining fiber is expressed by equation 3.

$$L_{Pig} \approx \frac{3}{4} \times \frac{\lambda_0^2}{\Delta\lambda} \times \frac{L_{Beat\ 1}}{\lambda_{Beat\ 1}}. \quad \text{(Equation 3)}$$

4. The depolarized laser diode module of claim 2, wherein the length $L_{Pig}$ of the polarization maintaining fiber is expressed by equation 2'.

$$L_{Pig} = \frac{1}{4} \times \frac{\lambda_0^2}{\Delta\lambda} \times \frac{L_{Beat\ 1}}{\lambda_{Beat\ 1}}. \quad \text{(Equation 2')}$$

5. The depolarized laser diode module of claim 3, wherein the length $L_{Pig}$ of the polarization maintaining fiber is expressed by equation 3'.

$$L_{Pig} = \frac{3}{4} \times \frac{\lambda_0^2}{\Delta\lambda} \times \frac{L_{Beat\ 1}}{\lambda_{Beat\ 1}}. \quad \text{(Equation 3')}$$

6. The depolarized laser diode module of claim 1, wherein the length $L_{Pig}$ of the polarization maintaining fiber is equal to or larger than a length in which there is no variation of an extinction ratio.

7. A depolarized laser diode module comprising:
   a laser diode module having one laser diode and one polarization maintaining fiber which is connected to an output side of the laser diode and;
   a depolarizer connected to said laser diode module,
   wherein a length $L_{Depo}$ of the depolarizer is a value obtained by calculation of equation 4 with use of a longitudinal mode spacing $\Delta\lambda$ of output light from the laser diode which is greater than zero, an oscillating center wavelength $\lambda_0$ of the laser light which is greater than zero, a beat length $L_{Beat\ 2}$ which is greater than zero of a birefringent material used in said depolarizer which is greater than zero and an optical wavelength $\lambda_{Beat\ 2}$ used in a measurement of the beat length $L_{Beat\ 2}$.

$$L_{Depo} < \frac{\lambda_0^2}{\Delta\lambda} \times \frac{L_{Beat\ 2}}{\lambda_{Beat\ 2}}. \quad \text{(Equation 4)}$$

8. The depolarized laser diode module of claim 7, wherein the length $L_{Depo}$ of the depolarizer is expressed by equation 5.

$$L_{Depo} \approx \frac{1}{2} \times \frac{\lambda_0^2}{\Delta\lambda} \times \frac{L_{Beat\ 2}}{\lambda_{Beat\ 2}}. \quad \text{(Equation 5)}$$

9. The depolarized laser diode module of claim 8, wherein the length $L_{Depo}$ of the depolarizer is expressed by equation 5'.

$$L_{Depo} = \frac{1}{2} \times \frac{\lambda_0^2}{\Delta\lambda} \times \frac{L_{Beat\ 2}}{\lambda_{Beat\ 2}}. \quad \text{(Equation 5')}$$

10. The depolarized laser diode module of claim 9, wherein a length $L_{Pig}$ of the polarization maintaining fiber is a value obtained by calculation of equation 1 with use of a longitudinal mode spacing $\Delta\lambda$ of output light from the laser diode, an oscillating center wavelength $\lambda_0$ of the laser light, a beat length $L_{Beat\ 1}$ of the polarization maintaining fiber and an optical wavelength $\lambda_{Beat}$ used in a measurement of beat length $L_{Beat\ 1}$.

$$L_{Pig} < \frac{\lambda_0^2}{\Delta\lambda} \times \frac{L_{Beat\ 1}}{\lambda_{Beat\ 1}}. \quad \text{(Equation 1)}$$

11. An optical amplifier which uses a depolarized laser diode module as claimed in claim 10 as a pump light source.

12. A Raman amplifier which uses a depolarized laser diode module as claimed in claim 10 as a pump light source.

13. The depolarized laser diode module of claim 10, wherein a Fiber Bragg Grating is formed in the polarization maintaining fiber.

14. The depolarized laser diode module of claim 10, wherein a polarization maintaining fiber is used as the depolarizer.

15. The depolarized laser diode module of claim 14, wherein an extinction ratio of laser light output from the polarization maintaining fiber of said laser diode module is equal to or more than 15 dB.

16. The depolarized laser diode module of claim 10, wherein a birefringent crystal is used as the depolarizer.

17. The depolarized laser diode module of claim 16, wherein a polarization direction of laser light inputted to the birefringent crystal is adjusted by inserting a λ/2 wavelength plate at an input side of the birefringent crystal.

18. The depolarized laser diode module of claim 16, wherein an extinction ratio of laser light output from the polarization maintaining fiber of said laser diode module is equal to or more than 15 dB.

19. The depolarized laser diode module of claim 10, wherein the length $L_{Pig}$ of the polarization maintaining fiber is expressed by equation 2.

$$L_{Pig} \approx \frac{1}{4} \times \frac{\lambda_0^2}{\Delta\lambda} \times \frac{L_{Beat\ 1}}{\lambda_{Beat\ 1}}. \quad \text{(Equation 2)}$$

20. The depolarized laser diode module of claim 19, wherein the length $L_{Pig}$ of the polarization maintaining fiber is expressed by equation 2'.

$$L_{Pig} = \frac{1}{4} \times \frac{\lambda_0^2}{\Delta\lambda} \times \frac{L_{Beat\ 1}}{\lambda_{Beat\ 1}}. \quad \text{(Equation 2')}$$

21. An optical amplifier which uses a depolarized laser diode module as claimed in claim 20 as a pump light source.

22. A Raman amplifier which uses a depolarized laser diode module as claimed in claim 20 as a pump light source.

23. The depolarized laser diode module of claim 10, wherein the length $L_{Pig}$ of the polarization maintaining fiber is expressed by equation 3.

$$L_{Pig} \approx \frac{3}{4} \times \frac{\lambda_0^2}{\Delta\lambda} \times \frac{L_{Beat\ 1}}{\lambda_{Beat\ 1}}. \quad \text{(Equation 3)}$$

24. The depolarized laser diode module of claim 23, wherein the length $L_{Pig}$ of the polarization maintaining fiber is expressed by equation 3'.

$$L_{Pig} = \frac{3}{4} \times \frac{\lambda_0^2}{\Delta\lambda} \times \frac{L_{Beat\ 1}}{\lambda_{Beat\ 1}}. \quad \text{(Equation 3')}$$

25. An optical amplifier which uses a depolarized laser diode module as claimed in claim 24 as a pump light source.

26. A Raman amplifier which uses a depolarized laser diode module as claimed in claim 24 as a pump light source.

27. The depolarized laser diode module of claim 9, wherein the length $L_{Pig}$ of the polarization maintaining fiber is equal to or larger than a length in which there is no variation of an extinction ratio.

28. An optical amplifier which uses a depolarized laser diode module as claimed in claim 27 as a pump light source.

29. A Raman amplifier which uses a depolarized laser diode module as claimed in claim 27 as a pump light source.

30. The depolarized laser diode module of claim 9, wherein a length $L_{Pig}$ of the polarization maintaining fiber which is greater than zero is expressed by equation 7.

$$L_{Pig} \leq \frac{3}{2} \times L_{Depo} \times \frac{L_{Beat\ 1}}{\lambda_{Beat\ 1}} \times \frac{\lambda_{Beat\ 2}}{L_{Beat\ 2}}. \quad \text{(Equation 7)}$$

31. The depolarized laser diode module wherein used as the depolarizer is a Lyot type consists of spliced two birefringent mediums with a length of $L_{Depo}$ as claimed in claim 9 and $2 \times L_{Depo}$ respectively in such a way that an angle of optical principal axes of the birefringent mediums is set at 45°.

32. The depolarized laser diode module of claim 31, wherein: said birefringent mediums are polarization maintaining fibers.

33. The depolarized laser diode module of claim 31, wherein: said birefringent mediums are birefringent crystals.

34. The depolarized laser diode module of claim 7, wherein the length $L_{Depo}$ of the depolarizer is calculated by equation 6 with use of a spectrum FWHM (full width half maximum) $\delta\lambda_{FWHM}$ of said laser diode module and a target DOP value.

$$L_{Depo} \geq \frac{1}{\pi} \times \frac{\left(\lambda_0 - \frac{1}{2}\delta\lambda_{FWHM}\right)\left(\lambda_0 + \frac{1}{2}\delta\lambda_{FWHM}\right)}{\delta\lambda_{FWHM}} \times \frac{L_{Beat\ 2}}{\lambda_{Beat\ 2}} \times \text{Log}_e\left(\frac{DOP}{100}\right) \quad \text{(Equation 6)}$$

35. The depolarized laser diode module of claim 34, wherein a length $L_{Pig}$ of the polarization maintaining fiber is a value obtained by calculation of equation 1 with use of a longitudinal mode spacing $\Delta\lambda$ of output light from the laser diode, an oscillating center wavelength $\lambda_0$ of the laser light, a beat length $L_{Beat\ 1}$ of the polarization maintaining fiber and an optical wavelength $\lambda_{Beat}$ used in a measurement of the beat length $L_{Beat\ 1}$.

$$L_{Pig} < \frac{\lambda_0^2}{\Delta\lambda} \times \frac{L_{Beat\ 1}}{\lambda_{Beat\ 1}}. \quad \text{(Equation 1)}$$

36. An optical amplifier which uses a depolarized laser diode module as claimed in claim 35 as a pump light source.

37. A Raman amplifier which uses a depolarized laser diode module as claimed in claim 35 as a pump light source.

38. The depolarized laser diode module of claim 35, wherein a Fiber Bragg Grating is formed in the polarization maintaining fiber.

39. The depolarized laser diode module of claim 35, wherein a polarization maintaining fiber is used as the depolarizer.

40. The depolarized laser diode module of claim 39, wherein an extinction ratio of laser light output from the polarization maintaining fiber of said laser diode module is equal to or more than 15 dB.

41. The depolarized laser diode module of claim 35, wherein a birefringent crystal is used as the depolarizer.

42. The depolarized laser diode module of claim 41, wherein a polarization direction of laser light inputted to the birefringent crystal is adjusted by inserting a λ/2 wavelength plate at an input side of the birefringent crystal.

43. The depolarized laser diode module of claim 41, wherein an extinction ratio of laser light output from the polarization maintaining fiber of said laser diode module is equal to or more than 15 dB.

44. The depolarized laser diode module of claim 35, wherein the length $L_{Pig}$ of the polarization maintaining fiber is expressed by equation 2.

$$L_{Pig} \approx \frac{1}{4} \times \frac{\lambda_0^2}{\Delta\lambda} \times \frac{L_{Beat\ 1}}{\lambda_{Beat\ 1}}. \quad \text{(Equation 2)}$$

45. The depolarized laser diode module of claim 44, wherein the length $L_{Pig}$ of the polarization maintaining fiber is expressed by equation 2'.

$$L_{Pig} = \frac{1}{4} \times \frac{\lambda_0^2}{\Delta\lambda} \times \frac{L_{Beat\ 1}}{\lambda_{Beat\ 1}}. \quad \text{(Equation 2')}$$

46. An optical amplifier which uses a depolarized laser diode module as claimed in claim 45 as a pump light source.

47. A Raman amplifier which uses a depolarized laser diode module as claimed in claim 45 as a pump light source.

48. The depolarized laser diode module of claim 35, wherein the length $L_{Pig}$ of the polarization maintaining fiber is expressed by equation 3.

$$L_{Pig} \approx \frac{3}{4} \times \frac{\lambda_0^2}{\Delta\lambda} \times \frac{L_{Beat\ 1}}{\lambda_{Beat\ 1}}. \quad \text{(Equation 3)}$$

49. The depolarized laser diode module of claim 48, wherein the length $L_{Pig}$ of the polarization maintaining fiber is expressed by equation 3'.

$$L_{Pig} = \frac{3}{4} \times \frac{\lambda_0^2}{\Delta\lambda} \times \frac{L_{Beat\ 1}}{\lambda_{Beat\ 1}}. \quad \text{(Equation 3')}$$

50. An optical amplifier which uses a depolarized laser diode module as claimed in claim 49 as a pump light source.

51. A Raman amplifier which uses a depolarized laser diode module as claimed in claim 49 as a pump light source.

52. The depolarized laser diode module of claim 34, wherein the length $L_{Pig}$ of the polarization maintaining fiber is equal to or larger than a length in which there is no variation of an extinction ratio.

53. An optical amplifier which uses a depolarized laser diode module as claimed in claim 52 as a pump light source.

54. A Raman amplifier which uses a depolarized laser diode module as claimed in claim 52 as a pump light source.

55. The depolarized laser diode module of claim 34, wherein a length $L_{Pig}$ of the polarization maintaining fiber is expressed by equation 7.

$$L_{Pig} \leq \frac{3}{2} \times L_{Depo} \times \frac{L_{Beat\ 1}}{\lambda_{Beat\ 1}} \times \frac{\lambda_{Beat\ 2}}{L_{Beat\ 2}}. \quad \text{(Equation 7)}$$

56. The depolarized laser diode module of claim 55, wherein a length $L_{Pig}$ of the polarization maintaining fiber which is greater than zero is expressed by equation 8.

$$L_{Pig} \approx \frac{1}{2} \times L_{Depo} \times \frac{L_{Beat\ 1}}{\lambda_{Beat\ 1}} \times \frac{\lambda_{Beat\ 2}}{L_{Beat\ 2}}. \quad \text{(Equation 8)}$$

57. The depolarized laser diode module of claim 56, wherein a length $L_{Pig}$ of the polarization maintaining fiber is expressed by equation 8'.

$$L_{Pig} = \frac{1}{2} \times L_{Depo} \times \frac{L_{Beat\ 1}}{\lambda_{Beat\ 1}} \times \frac{\lambda_{Beat\ 2}}{L_{Beat\ 2}}. \quad \text{(Equation 8')}$$

58. The depolarized laser diode module wherein used as the depolarizer is a Lyot type consists of spliced two birefringent mediums with a length of $L_{Depo}$ as claimed in claim 34 and $2 \times L_{Depo}$ respectively in such a way that an angle of optical principal axes of the birefringent mediums is set at 45°.

59. The depolarized laser diode module of claim 58, wherein: said birefringent mediums are polarization maintaining fibers.

60. The depolarized laser diode module of claim 58, wherein: said birefringent mediums are birefringent crystals.

61. The depolarized laser diode module of claim 7, wherein a length $L_{Pig}$ of the polarization maintaining fiber is a value obtained by calculation of equation 1 with use of a longitudinal mode spacing $\Delta\lambda$ of output light from the laser diode, an oscillating center wavelength $\lambda_0$ of the laser light, a beat length $L_{Beat\ 1}$ of the polarization maintaining fiber and an optical wavelength $\lambda_{Beat}$ used in an measurement of the beat length $L_{Beat\ 1}$.

$$L_{Pig} < \frac{\lambda_0^2}{\Delta\lambda} \times \frac{L_{Beat\ 1}}{\lambda_{Beat\ 1}}. \quad \text{(Equation 1)}$$

62. An optical amplifier which uses a depolarized laser diode module as claimed in claim 61 as a pump light source.

63. A Raman amplifier which uses a depolarized laser diode module as claimed in claim 61 as a pump light source.

64. The depolarized laser diode module of claim 61, wherein a Fiber Bragg Grating is formed in the polarization maintaining fiber.

65. The depolarized laser diode module of claim 61, wherein a polarization maintaining fiber is used as the depolarizer.

66. The depolarized laser diode module of claim 65, wherein an extinction ratio of laser light output from the polarization maintaining fiber of said laser diode module is equal to or more than 15 dB.

67. The depolarized laser diode module of claim 61, wherein a birefringent crystal is used as the depolarizer.

68. The depolarized laser diode module of claim 67, wherein a polarization direction of laser light inputted to the birefringent crystal is adjusted by inserting a λ/2 wavelength plate at an input side of the birefringent crystal.

69. The depolarized laser diode module of claim 67, wherein an extinction ratio of laser light output from the polarization maintaining fiber of said laser diode module is equal to or more than 15 dB.

70. The depolarized laser diode module of claim 61, wherein the length $L_{Pig}$ of the polarization maintaining fiber which is greater than zero is expressed by equation 2.

$$L_{Pig} \approx \frac{1}{4} \times \frac{\lambda_0^2}{\Delta\lambda} \times \frac{L_{Beat\ 1}}{\lambda_{Beat\ 1}}. \quad \text{(Equation 2)}$$

71. The depolarized laser diode module of claim 70, wherein the length $L_{Pig}$ of the polarization maintaining fiber is expressed by equation 2'.

$$L_{Pig} = \frac{1}{4} \times \frac{\lambda_0^2}{\Delta\lambda} \times \frac{L_{Beat\ 1}}{\lambda_{Beat\ 1}}. \quad \text{(Equation 2')}$$

72. An optical amplifier which uses a depolarized laser diode module as claimed in claim 71 as a pump light source.

73. A Raman amplifier which uses a depolarized laser diode module as claimed in claim 71 as a pump light source.

74. The depolarized laser diode module of claim 61, wherein the length $L_{Pig}$ of the polarization maintaining fiber is expressed by equation 3.

$$L_{Pig} \approx \frac{3}{4} \times \frac{\lambda_0^2}{\Delta\lambda} \times \frac{L_{Beat\ 1}}{\lambda_{Beat\ 1}}. \quad \text{(Equation 3)}$$

75. The depolarized laser diode module of claim 74, wherein the length $L_{Pig}$ of the polarization maintaining fiber is expressed by equation 3'.

$$L_{Pig} = \frac{3}{4} \times \frac{\lambda_0^2}{\Delta\lambda} \times \frac{L_{Beat\ 1}}{\lambda_{Beat\ 1}}. \quad \text{(Equation 3')}$$

76. An optical amplifier which uses a depolarized laser diode module as claimed in claim 71 as a pump light source.

77. A Raman amplifier which uses a depolarized laser diode module as claimed in claim 75 as a pump light source.

78. The depolarized laser diode module of claim 7, wherein the length $L_{Pig}$ of the polarization maintaining fiber is equal to or larger than a length in which there is no variation of an extinction ratio.

79. An optical amplifier which uses a depolarized laser diode module as claimed in claim 78 as a pump light source.

80. A Raman amplifier which uses a depolarized laser diode module as claimed in claim 78 as a pump light source.

81. The depolarized laser diode module of claim 7, wherein a length $L_{Pig}$ of the polarization maintaining fiber which is greater than zero is expressed by equation 7.

$$L_{Pig} \leq \frac{3}{2} \times L_{Depo} \times \frac{L_{Beat\ 1}}{\lambda_{Beat\ 1}} \times \frac{\lambda_{Beat\ 2}}{L_{Beat\ 2}}. \quad \text{(Equation 7)}$$

82. The depolarized laser diode module of claim 81, wherein a length $L_{Pig}$ of the polarization maintaining fiber is expressed by equation 8.

$$L_{Pig} \approx \frac{1}{2} \times L_{Depo} \times \frac{L_{Beat\ 1}}{\lambda_{Beat\ 1}} \times \frac{\lambda_{Beat\ 2}}{L_{Beat\ 2}}. \quad \text{(Equation 8)}$$

83. The depolarized laser diode module of claim 82, wherein a length $L_{Pig}$ of the polarization maintaining fiber is expressed by equation 8'.

$$L_{Pig} = \frac{1}{2} \times L_{Depo} \times \frac{L_{Beat\ 1}}{\lambda_{Beat\ 1}} \times \frac{\lambda_{Beat\ 2}}{L_{Beat\ 2}}. \quad \text{(Equation 8')}$$

84. The depolarized laser diode module wherein used as the depolarizer is a Lyot type consists of spliced two birefringent mediums with a length of $L_{Depo}$ as claimed in claim 7 and $2 \times L_{Depo}$ respectively in such a way that an angle of optical principal axes of the birefringent mediums is set at 45°.

85. The depolarized laser diode module of claim 84, wherein: said birefringent mediums are polarization maintaining fibers.

86. The depolarized laser diode module of claim 84, wherein: said birefringent mediums are birefringent crystals.

* * * * *